(12) United States Patent
Baek et al.

(10) Patent No.: US 11,393,864 B2
(45) Date of Patent: Jul. 19, 2022

(54) IMAGE SENSOR

(71) Applicant: SAMSUNG ELECTRONICS CO., LTD., Suwon-si (KR)

(72) Inventors: Ingyu Baek, Seoul (KR); Doowon Kwon, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 10 days.

(21) Appl. No.: 16/821,352

(22) Filed: Mar. 17, 2020

(65) Prior Publication Data

US 2021/0050379 A1 Feb. 18, 2021

(30) Foreign Application Priority Data

Aug. 12, 2019 (KR) .................. 10-2019-0098327

(51) Int. Cl.
*H01L 31/00* (2006.01)
*H01L 27/146* (2006.01)
*H01L 23/00* (2006.01)

(52) U.S. Cl.
CPC ........ *H01L 27/14634* (2013.01); *H01L 24/05* (2013.01); *H01L 24/08* (2013.01); *H01L 27/14632* (2013.01); *H01L 27/14645* (2013.01); *H01L 2224/05082* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05166* (2013.01); *H01L 2224/05181* (2013.01); *H01L 2224/08145* (2013.01)

(58) Field of Classification Search
None
See application file for complete search history.

(56) References Cited

U.S. PATENT DOCUMENTS

| 8,878,325 | B2 | 11/2014 | Wan et al. |
| 9,391,109 | B2 | 7/2016 | Chen et al. |
| 9,412,725 | B2 | 8/2016 | Chen et al. |
| 2011/0042814 | A1* | 2/2011 | Okuyama ......... H01L 27/14634 257/758 |

(Continued)

FOREIGN PATENT DOCUMENTS

JP 2018-182038 11/2018

*Primary Examiner* — Hung K Vu
(74) *Attorney, Agent, or Firm* — F. Chau & Associates, LLC

(57) ABSTRACT

An image sensor is provided. The image sensor includes a first substrate; a plurality of photoelectric conversion units positioned in the first substrate; a first connection layer disposed on the first substrate; a plurality of first pixel pads disposed on the first connection layer; a plurality of first peripheral pads disposed on the first substrate; a plurality of second pixel pads respectively positioned on the plurality of first pixel pads; a plurality of second peripheral pads respectively positioned on the plurality of first peripheral pads; a second connection layer disposed on the plurality of second pixel pads and the plurality of second peripheral pads; a device disposed on the second connection layer; and a second substrate disposed on the second connection layer and the device, wherein a pitch of the plurality of first pixel pads is substantially the same as a pitch of the plurality of pixel regions of the first substrate.

18 Claims, 12 Drawing Sheets

(56) References Cited

U.S. PATENT DOCUMENTS

| | | | |
|---|---|---|---|
| 2014/0042299 A1* | 2/2014 | Wan | H01L 27/14634 250/208.1 |
| 2018/0138223 A1 | 5/2018 | Kotoo et al. | |
| 2018/0233435 A1 | 8/2018 | Fujii et al. | |
| 2019/0103425 A1 | 4/2019 | Yoon et al. | |
| 2020/0035737 A1 | 1/2020 | Ito et al. | |

* cited by examiner

IMAGE SENSOR

CROSS-REFERENCE TO RELATED APPLICATION

This U.S. non-provisional patent application claims the benefit of priority under 35 U.S.C. § 119 to Korean Patent Application No. 10-2019-0098327, filed on Aug. 12, 2019, in the Korean Intellectual Property Office, the disclosure of which is incorporated by reference in its entirety herein.

BACKGROUND

1. Technical Field

The inventive concept relates to an image sensor. More specifically, the inventive concept relates to a stack-type image sensor including stacked structures.

2. Discussion of Related Art

An image sensor is a device for converting an optical image into an electrical signal. Examples of image sensors include a charge-coupled device (CCD) and an active-pixel sensor (CMOS sensor). An image sensor may be used in a camera of a portable electronic device such as a smart phone or a tablet. However, due to the size of the image sensor, it can be difficult to reduce the size the portable electric device.

A stack-type image sensor has been developed to reduce the size of the portable electronic device and improve the performance of the camera. The stack-type image sensor may achieve a reduction in planar area, an improvement in resolution, and an improvement in signal processing speed.

SUMMARY

At least one embodiment of the inventive concept provides a stack-type image sensor.

According to an exemplary embodiment of the inventive concept, there is provided an image sensor including a first substrate including a pixel array region including a plurality of pixel regions and a peripheral region around the pixel array region; a plurality of photoelectric conversion units respectively positioned in the plurality of pixel regions of the first substrate; a first connection layer disposed on the pixel array region and the peripheral region of the first substrate; a plurality of first pixel pads disposed on a portion of the first connection layer on the pixel array region of the first substrate; a plurality of first peripheral pads disposed on a portion of the first connection layer on the peripheral region of the first substrate; a plurality of second pixel pads respectively positioned on the plurality of first pixel pads; a plurality of second peripheral pads respectively positioned on the plurality of first peripheral pads; a second connection layer disposed on the plurality of second pixel pads and the plurality of second peripheral pads; a device disposed on the second connection layer; and a second substrate disposed on the second connection layer and the device, wherein a pitch of the plurality of first pixel pads in a first horizontal direction is substantially the same as a pitch of the plurality of pixel regions of the first substrate in the first horizontal direction, and wherein a center of each of the plurality of first pixel pads is spaced by a predetermined distance in a second horizontal direction from a center of each of the plurality of pixel regions of the first substrate.

According to an exemplary embodiment of the inventive concept, there is provided an image sensor including: a first structure including a first substrate including a plurality of pixel regions, a plurality of photoelectric conversion units respectively positioned in the plurality of pixel regions of the first substrate, a first connection layer disposed on the first substrate, and a plurality of first pixel pads disposed on the first connection layer; and a second structure including a second substrate, a device on the second substrate, a second connection layer disposed on the second substrate and the device, and a plurality of second pixel pads disposed on the second connection layer, wherein the first pixel pads respectively contact the plurality of second pixel pads, wherein the first connection layer includes an insulating layer disposed on the first substrate, and a conductive pattern disposed in the insulating layer, wherein a portion of the first connection layer positioned on the plurality of pixel regions of the first substrate includes a plurality of overlapping portions respectively overlapping the plurality of first pixel pads in a plan view and a plurality of non-overlapping portions that do not overlap the plurality of first pixel pads in the plan view, and wherein a ratio of a total volume of a plurality of portions of the conductive pattern positioned respectively in the plurality of overlapping portions of the first connection layer with respect to total volume of a plurality of portions of the insulating layer positioned respectively in the plurality of overlapping portions of the first connection layer is less than a ratio of a total volume of a plurality of portions of the conductive pattern positioned respectively in the plurality of non-overlapping portions of the first connection layer with respect to total volume of a plurality of portions of the insulating layer positioned respectively in the plurality of non-overlapping portions of the first connection layer.

According to an exemplary embodiment of the inventive concept, there is provided an image sensor including: a first structure including a first substrate including a plurality of shared pixel regions each including a first pixel region and a second pixel region, a plurality of first photoelectric conversion units each positioned in the first pixel region of each of the plurality of shared pixel regions of the first substrate, a plurality of second photoelectric conversion units each positioned in the second pixel region of each of the plurality of shared pixel regions of the first substrate, a plurality of shared floating diffusion regions positioned on the first pixel region and the second pixel region of each of the plurality of shared pixel regions, a first connection layer disposed on the first substrate, and a plurality of first pixel pads and a plurality of second pixel pads disposed on the first connection layer; and a second structure including a second substrate, a device disposed on the second substrate, a second connection layer on the second substrate and the device, and a plurality of third pixel pads and a plurality of fourth pixel pads on the second connection layer, wherein the first structure contacts the second structure such that the plurality of first pixel pads respectively contact the plurality of third pixel pads and the plurality of second pixel pads respectively contact the plurality of fourth pixel pads, wherein a pitch of the plurality of first pixel pads in a first horizontal direction and a pitch of the plurality of second pixel pads in the first horizontal direction are substantially same as a pitch of the plurality of shared pixel regions in the first horizontal direction, and wherein an intra-shared pixel distance between the plurality of first pixel pads and the plurality of second pixel pads in a second horizontal direction is substantially different from an inter-shared pixel distance between the plurality of first pixel pads and the plurality of second pixel pads in the second horizontal direction.

According to an exemplary embodiment of the inventive concept, an image sensor is provided including a first substrate having a pixel region including a photoelectric conversion unit, a first connection layer disposed on the pixel region, a first pixel pad comprising a conductive and reflective material disposed on the first connection layer within the pixel region without overlapping the photoelectric conversion unit in a plan view, a second pixel pad positioned on the first pixel pad, a second connection layer disposed on the second pixel pad, a device disposed on the second connection layer to control the pixel photoelectric conversion unit, and a second substrate disposed on the second connection layer and the device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
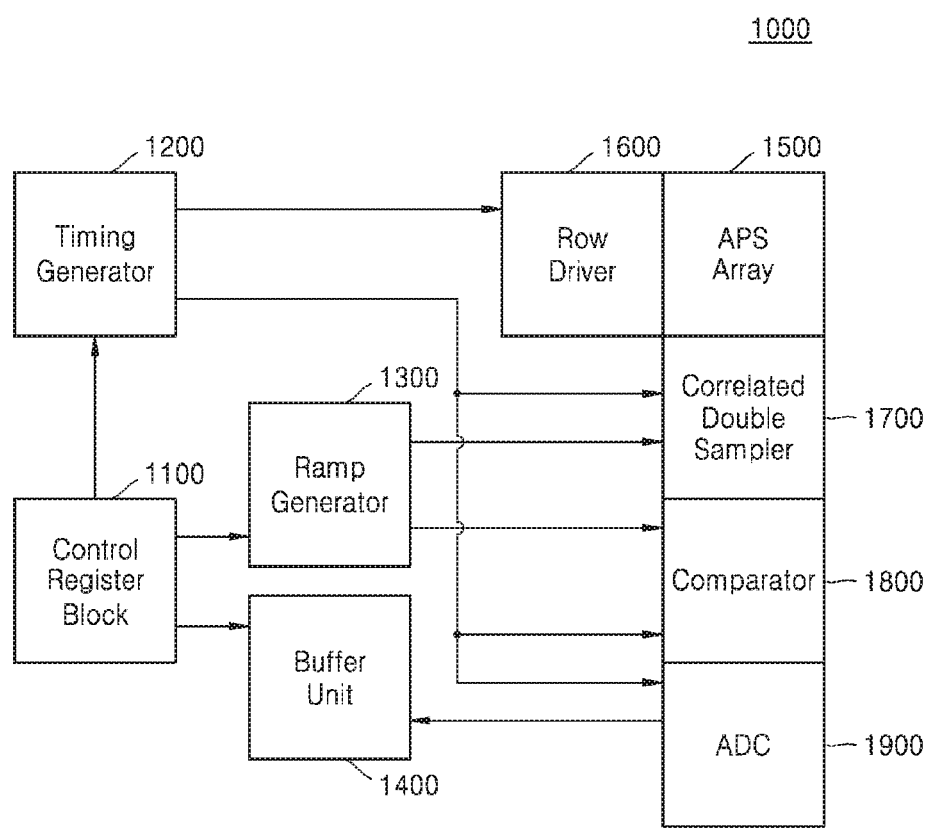
FIG. 1 is a block diagram of an image sensor according to an exemplary embodiment of the inventive concept.

In the present specification, the Z direction shown in the drawings may be referred to as a vertical direction, and any direction perpendicular to the Z direction, for example, the X direction or the Y direction may be referred to as a horizontal direction. Further, objects that overlap one another in the Z direction may be referred to as overlapping one another in a plan view. In an exemplary embodiment, the X direction is substantially perpendicular or exactly perpendicular to the Y direction.

In the present specification, the overlapping of a first object and a second object in the Z direction means that the projection of the first object onto a plane perpendicular to the Z direction (e.g., the XY plane) overlaps the projection of the second object onto the same plane.

In this specification, two values being described as substantially the same means that the difference between the two values is within the difference between the two values that are designed or intended to be the same but may occur due to an error in the manufacturing process. For example, two values being substantially the same means that the difference between the two values is within 10% of each of the two values, such as within 5%. As used herein, two values being substantially different means that the difference between the two values is greater than the difference between the two values that are designed or intended to be the same but may occur due to an error in the manufacturing process. For example, two values being substantially different means that the difference between the two values is greater than 10%.

In this specification, the distance between a first object and a second object may be defined as the distance between the center of the first object and the center of the second object.

Hereinafter, exemplary embodiments of the inventive concept will be described in detail with reference to the accompanying drawings. Like reference numerals refer to like elements throughout this application.

FIG. 1 is a block diagram of an image sensor 1000 according to an exemplary embodiment of the inventive concept.

Referring to FIG. 1, the image sensor 1000 includes a control register block 1100 (e.g., a control circuit), a timing generator 1200 (e.g., a timing controller or control circuit), a ramp generator 1300 (e.g., voltage generator), a buffer unit 1400 (e.g., a buffer or buffer circuit), an active pixel sensor array 1500, a row driver 1600 (e.g., a driver circuit), a correlated double sampler 1700, a comparator 1800 (e.g., a comparison circuit), and an analog-to-digital converter 1900.

The control register block 1100 may generally control an operation of the image sensor 1000. For example, the control register block 1100 may transmit an operation signal to the timing generator 1200, the ramp generator 1300, and the buffer unit 1400. The timing generator 1200 may generate and transmit an operation timing reference signal to the row driver 1600, the correlated double sampler 1700, the comparator 1800, and/or the analog-to-digital converter 1900. The ramp generator 1300 may generate and transmit a ramp signal (or ramp voltage) to the correlated double sampler 1700 and/or the comparator 1800. The buffer unit 1400 may temporarily store an image signal to be transmitted outside the image sensor 1000 and transmit image data to an external device. The active pixel sensor array 1500 may sense an external image. The active pixel sensor array 1500 may include a plurality of pixels (e.g., a pixel P shown in FIG. 2, a shared pixel 2SP shown in FIG. 8, or a shared pixel 4SP shown in FIG. 11). The row driver 1600 may selectively activate a row of the active pixel sensor array 1500. The correlated double sampler 1700 may sample and output an analog signal generated from the active pixel sensor array 1500. The comparator 1800 may generate various reference signals by comparing data transmitted from the correlated double sampler 1700 to an inclination of the ramp signal fed back according to the analog reference voltages. The analog-to-digital converter 1900 may convert analog image data into digital image data.

Figure 4:
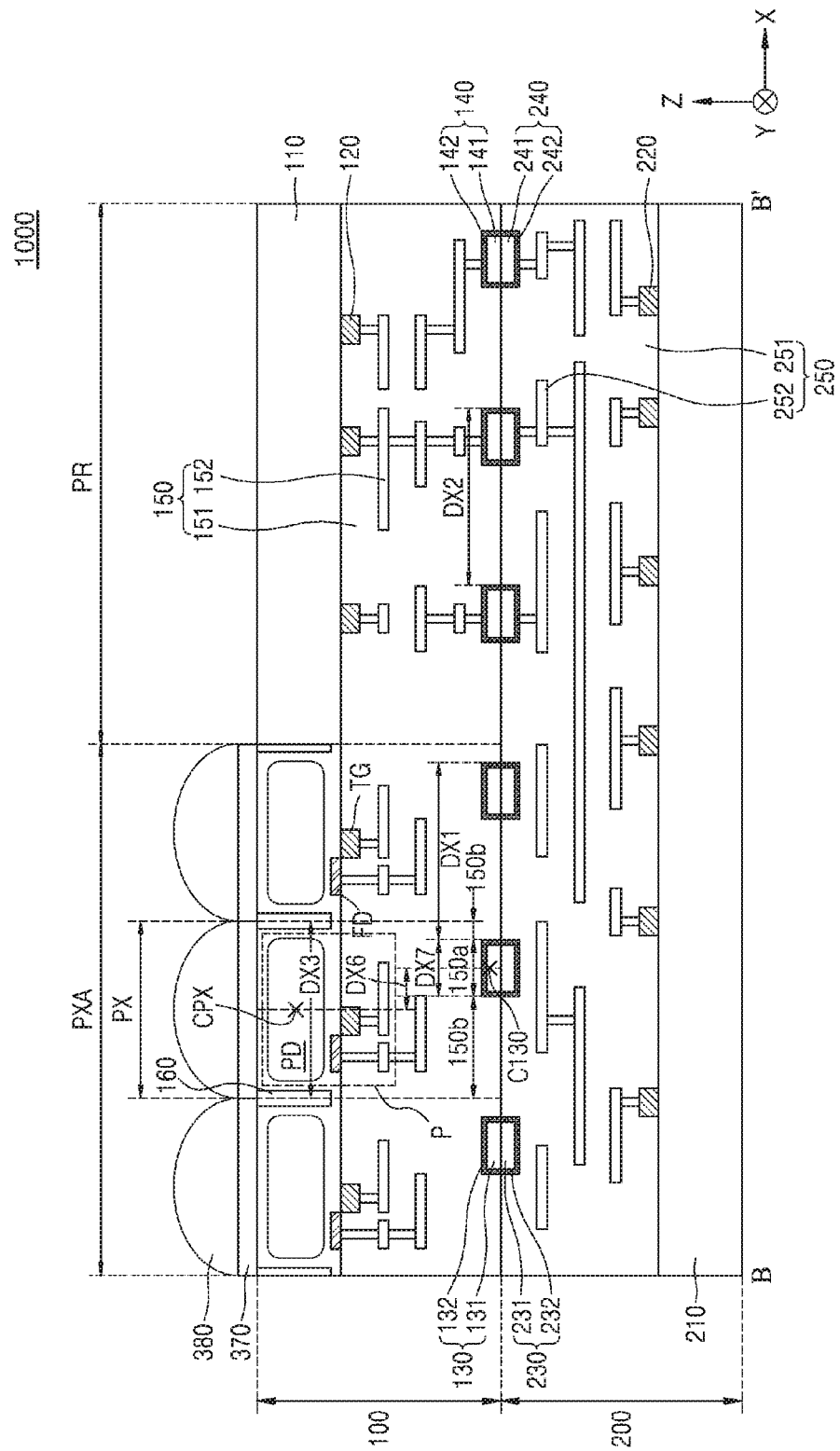
FIG. 4 is a cross-sectional view of an image sensor according to an exemplary embodiment of the inventive concept, taken along a line BB' of FIG. 3.

The active pixel sensor array 1500 may be positioned in or on a pixel array region PXA of a first substrate 110 of a first structure 100 (e.g., a pixel wafer) illustrated in FIG. 4. In addition, each of the control register block 1100, the timing generator 1200, the ramp generator 1300, the buffer unit 1400, the row driver 1600, the correlated double sampler 1700, the comparator 1800, and the analog-to-digital converter 1900 may be positioned on a peripheral region PR of the first substrate 110 of the first structure 100 illustrated in FIG. 4 or on a second substrate 210 of a second structure 200 (e.g., a logic wafer).

Figure 2:
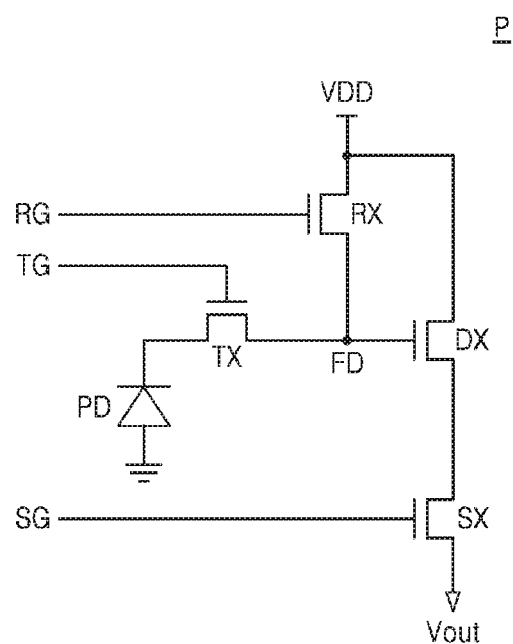
FIG. 2 is a circuit diagram of a pixel circuit included in an image sensor according to an exemplary embodiment of the inventive concept.

FIG. 2 is a circuit diagram of a pixel circuit P included in an image sensor according to exemplary embodiment of the inventive concept.

Referring to FIG. 2, each pixel circuit P may include a photoelectric conversion unit PD (e.g., a photodiode), a floating diffusion region FD, and a plurality of transistors such as a transfer transistor TX, a drive transistor DX, a selection transistor SX, and a reset transistor RX.

The photoelectric conversion unit PD may absorb light to generate and accumulate charges corresponding to an amount or intensity of the light. The transfer transistor TX may include a transfer gate TG. The transfer gate TG may transfer the charges accumulated in the photoelectric conversion unit PD to the floating diffusion region FD. The floating diffusion region FD may accumulate cumulatively the charges received from the photoelectric conversion unit PD. The drive transistor DX may be controlled according to an amount of charges accumulated in the floating diffusion region FD. In some embodiments, the pixel circuit P does not include the transfer gate TG. That is, the photoelectric conversion unit PD of the pixel circuit P may be directly connected to the floating diffusion region FD.

The source of the drive transistor DX may be connected to a power supply voltage VDD, and the drain of the drive transistor DX may be connected to the source of the selection transistor SX. The drive transistor DX may serve as a source follower buffer amplifier that generates a source-drain current in proportion to charges input to the gate. The drive transistor DX may amplify a potential change in the floating diffusion region FD and transfer the amplified signal to the selection transistor SX.

The select transistor SX may include a selection gate SG and may be controlled by a row selection signal input from a row driver (e.g., the row driver 1600 illustrated in FIG. 1). Specifically, the selection transistor SX may output a signal output to the drain of the drive transistor DX to an output line Vout according to a row selection signal.

The reset transistor RX may reset the charges accumulated in the floating diffusion region FD. For example, the reset transistor RX may include a reset gate RG, the drain of the reset transistor RX may be connected to the floating diffusion region FD, and the source of the reset transistor RX may be connected to the power supply voltage VDD. The reset transistor RX may be controlled by a reset signal. Specifically, the reset transistor RX may transfer the power supply voltage VDD connected to the source of the reset transistor RX to the floating diffusion region FD according to the reset signal. Therefore, the charges accumulated in the floating diffusion region FD may be discharged by the reset transistor RX and thus the floating diffusion region FD may be reset.

Figure 3:
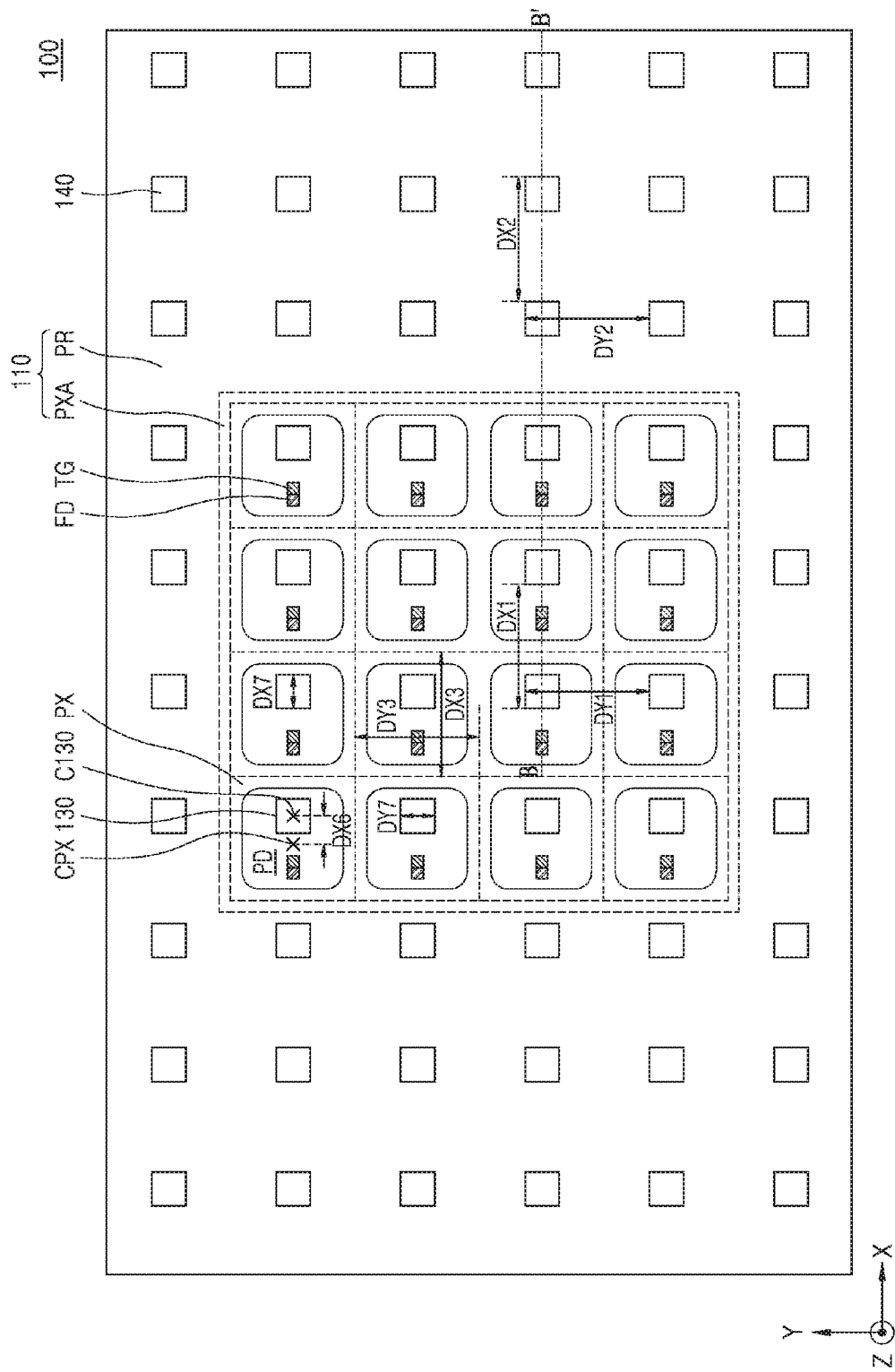
FIG. 3 is a plan view of a first structure included in an image sensor according to an exemplary embodiment of the inventive concept.

FIG. 3 is a plan view of the first structure 100 included in the image sensor 1000 according to an exemplary embodiment of the inventive concept. FIG. 4 is a cross-sectional view of the image sensor 1000 according to an exemplary embodiment of the inventive concept along a line BB' of FIG. 3.

Referring to FIGS. 3 and 4, the image sensor 1000 includes the first structure 100 and the second structure 200. The first structure 100 includes the first substrate 110, a plurality of photoelectric conversion units PD in the first substrate 110, a first connection layer 150 disposed on the first substrate 110, and a plurality of first pixel pads 130 disposed on the first connection layer 150. The second structure 200 includes the second substrate 210, a device 220 disposed on the second substrate 210, a second connection layer 250 disposed on the second substrate 210 and the device 220, and a plurality of second pixel pads 230 disposed on the second connection layer 250. In an exemplary embodiment, the first structure 100 is in contact (e.g., direct contact) with the second structure 200 since the plurality of first pixel pads 130 contact the plurality of second pixel pads 230, respectively. The first structure 100 and the second structure 200 may be bonded by direct bonding between the first pixel pads 130 and the second pixel pads 230.

In an exemplary embodiment, the first structure 100 further includes a plurality of first peripheral pads 140 disposed on the first connection layer 150, and the second structure 200 further includes a plurality of second peripheral pads 240 disposed on the second connection layer 250. In an exemplary embodiment, the plurality of first peripheral pads 140 contact (e.g., directly contact) the plurality of second peripheral pads 240, respectively. The first structure 100 and the second structure 200 may be bonded by the direct bonding between the first pixel pad 130 and the second pixel pad 230 and between the first peripheral pad 140 and the second peripheral pad 240.

That is, the image sensor 1000 may include the first substrate 110, the plurality of photoelectric conversion units PD in the first substrate 110, the first connection layer 150 disposed on the first substrate 110, the plurality of first pixel pads 130 and the plurality of first peripheral pads 140 disposed on the first connection layer 150, a plurality of second pixel pads 230 respectively positioned on the plurality of first pixel pads 130, the plurality of second peripheral pads 240 respectively positioned on the plurality of first peripheral pads 140, the second connection layer 250 disposed on the plurality of second pixel pads 230 and the plurality of second peripheral pads 240, the device 220 disposed on the second connection layer 250 and the second substrate 210 disposed on the second connection layer 250 and the device 220.

The first substrate 110 includes the pixel array region PXA including a plurality of pixel regions PX. The plurality of pixel regions PX may be arranged at a constant pitch in the X direction and the Y direction. For example, the pixel regions PX may be equally spaced apart from one another throughout the pixel array region PXA. In an exemplary embodiment, a pitch DX3 of the plurality of pixel regions PX in the X direction is the same as the length of each pixel region PX in the X direction, and a pitch DY3 of the plurality of pixel regions PX in the Y direction is the same as the length of each pixel region PX in the Y direction. In an exemplary embodiment, the pitch DX3 of the plurality of pixel regions PX in the X direction is the same as the pitch DY3 of the plurality of pixel regions PX. In an exemplary embodiment, the pitch DX3 of the plurality of pixel regions PX in the X direction and the pitch DY3 of the plurality of pixel regions PX is about 0.5 μm to about 5 μm. In some embodiments, the first substrate 110 further includes the peripheral region PR around the pixel array region PXA. In an exemplary embodiment, the peripheral region PR of the first substrate 110 surrounds the pixel array region PXA of the first substrate 110. The second substrate 210 may be spaced apart from the first substrate 110 in the Z direction. An upper surface of the second substrate 210 faces a lower surface of the first substrate 110.

The first substrate 110 and the second substrate 210 may include, for example, a Group IV semiconductor material, a Group III-V semiconductor material, a Group II-VI semiconductor material, or a combination thereof. The Group IV semiconductor material may include, for example, silicon (Si), germanium (Ge), or a combination thereof. The Group III-V semiconductor material may include, for example, gallium arsenide (GaAs), indium phosphorus (InP), gallium phosphorus (GaP), indium arsenide (InAs), indium antimony (InSb), or a combination thereof. The Group II-VI semiconductor material may include, for example, zinc telluride (ZnTe), cadmium sulfide (CdS), or a combination thereof.

In an exemplary embodiment, the plurality of photoelectric conversion units PD are positioned in the plurality of pixel regions PX of the first substrate 110, respectively. The photoelectric conversion unit PD may include, for example, a photo diode, a photo transistor, a photo gate, or a combination thereof. In an embodiment, the photodiode includes two impurity regions having different conductivity types.

The photoelectric conversion unit PD may be included in the pixel circuit P. The transfer gate TG and the floating diffusion region FD included in the pixel circuit P may be positioned on a pixel region PX of the first substrate 110. In some embodiments, unlike in FIG. 4, the transfer gate TG is omitted. The floating diffusion region FD may be separated from the photoelectric conversion unit PD by an isolation pattern (not shown) in some embodiments. In an exemplary embodiment, the floating diffusion region FD includes impurities of a conductivity type different from that of the first substrate 110. The drive transistor DX (see FIG. 2), the selection transistor SX (see FIG. 2), and the reset transistor RX (see FIG. 2) included in the pixel circuit P may be positioned on the pixel region PX of the first substrate 110. The pixel circuit P may further include a part of a first conductive pattern 152 of the first connection layer 150 connected to at least one of the photoelectric conversion unit PD, the transfer gate TG, the floating diffusion region FD, the drive transistor DX (see FIG. 2), the selection transistor SX (see FIG. 2), and the reset transistor (RX (see FIG. 2).

In an exemplary embodiment, the first structure 100 further includes a pixel separation pattern 160 disposed between the plurality of photoelectric conversion units PD. The pixel separation pattern 160 may be positioned at a boundary between the plurality of pixel regions PX of the first substrate 110. The pixel separation pattern 160 may surround each photoelectric conversion unit PD. The pixel separation pattern 160 may include an insulating material that may include, for example, silicon oxide, silicon nitride, or a combination thereof.

In an exemplary embodiment, the first structure 100 further includes a peripheral device 120 disposed on the peripheral region PR of the first substrate 110. The peripheral device 120 may include, for example, a transistor, a capacitor, a resistor, or a combination thereof. The peripheral device 120 and a part of the first conductive pattern 152 of the first connection layer 150 connected to the peripheral device 120 may constitute a peripheral circuit. The peripheral circuit may include a logic circuit, a memory circuit, or a combination thereof. The peripheral circuit may include at least one of, for example, the control register block 1100, the timing generator 1200, the ramp generator 1300, the buffer unit 1400, the row driver 1600, the correlated double sampler 1700, the comparator 1800, and the analog-to-digital converter 1900 illustrated in FIG. 1.

The device 220 disposed on the second substrate 210 may overlap the pixel array region PXA of the first substrate 110 in the Z direction, overlap the peripheral region PR of the first substrate 110 in the Z direction, or overlap the pixel array region PXA and the peripheral region PR of the first substrate 110 in the Z direction. The device 220 may include, for example, a transistor, a capacitor, a resistor, or a combination thereof. The device 220 and a part of a second conductive pattern 252 of the second connection layer 250 connected to the device 220 may constitute a circuit. The circuit may include a logic circuit, a memory circuit, or a combination thereof. The circuit may include at least one of, for example, the control register block 1100, the timing generator 1200, the ramp generator 1300, the buffer unit 1400, the row driver 1600, the correlated double sampler 1700, the comparator 1800, and the analog-to-digital converter 1900 illustrated in FIG. 1. For example, the circuit may include part or all of a circuit for controlling a pixel circuit (e.g., P, 2SP, 4SP) or a photoelectric conversion unit (e.g., PD, PDa, Pdb, Pdc, or Pdd).

The first connection layer 150 may be positioned on a lower surface of the first substrate 110, and the second connection layer 250 may be positioned on an upper surface of the second substrate 210. In an exemplary embodiment, the first connection layer 150 includes a first insulating layer 151 disposed on the lower surface of the first substrate 110 and a first conductive pattern 152 disposed in the first insulating layer 151. In an exemplary embodiment, the second connection layer 250 includes a second insulating layer 251 disposed on the upper surface of the second substrate 210 and a second conductive pattern 252 disposed in the second insulating layer 251. Each of the first insulating layer 151 and the second insulating layer 251 may include a plurality of insulating layers. Each of the first conductive pattern 152 and the second conductive pattern 252 may include a plurality of conductive lines (e.g., wires) and a plurality of conductive vias.

The first insulating layer 151 and the second insulating layer 251 may include an insulating material that may include, for example, silicon oxide, silicon nitride, a low-k material, or a combination thereof. The low-k material may be a material having a lower dielectric constant than silicon oxide, for example, phosphosilicate glass (PSG), borophosphosilicate glass (BPSG), fluorosilicate glass (FSG), organosilicate glass (OSG), spin-on-glass (SOG), spin-on-polymer, or a combination thereof. The first conductive pattern 152 and the second conductive pattern 252 may include conductive material that may include, for example, tungsten (W), copper (Cu), aluminum (Al), gold (Au), silver (Ag), or a combination thereof.

In an exemplary embodiment, the materials constituting the first insulating layer 151 and the second insulating layer 251 have a higher transmittance with respect to light of an operating wavelength range, such as a visible spectrum, an IR spectrum, or a UV spectrum, than the materials constituting the first conductive pattern 152 and the second conductive pattern 252. In an exemplary embodiment, the materials constituting the first conductive pattern 152 and the second conductive pattern 252 have a higher reflectivity with respect to the light of the operating wavelength range than the materials constituting the first insulating layer 151 and the second insulating layer 251.

The first connection layer 150 may electrically connect the plurality of pixel circuits P, the peripheral device 120, and the plurality of first peripheral pads 140. That is, the first conductive pattern 152 of the first connection layer 150 may contact the plurality of pixel circuits P, the peripheral device 120, and the plurality of first peripheral pads 140. The first conductive pattern 152 of the first connection layer 150 may include a portion (e.g., a first wire) connecting the plurality of pixels P to the peripheral device 120 and a portion (e.g., a second wire) connecting the peripheral device 120 to the plurality of first peripheral pads 140. In an exemplary embodiment, the first conductive pattern 152 of the first connection layer 150 does not contact at least one of the plurality of first pixel pads 130. In another exemplary embodiment, the first conductive pattern 152 of the first connection layer 150 does not contact all of the plurality of first pixel pads 130. That is, the first connection layer 150 does not electrically connect the plurality of pixel circuits P to the plurality of first pixel pads 130. In other words, the plurality of first pixel pads 130 may be dummy pads that do not provide an electrical connection.

The second connection layer 250 may electrically connect the device 220 to the plurality of second peripheral pads 240. That is, the second conductive pattern 252 of the second connection layer 250 may contact the device 220 and the plurality of second peripheral pads 240. In an exemplary embodiment, the second conductive pattern 252 of the second connection layer 250 does not contact at least one of the plurality of second pixel pads 230. In another exemplary embodiment, the second conductive pattern 252 of the second connection layer 250 does not contact all of the plurality of second pixel pads 230. That is, the second connection layer 250 does not electrically connect the device 220 to the plurality of second pixel pads 230. In other words, the plurality of second pixel pads 230 may be dummy pads that do not provide an electrical connection.

The plurality of first pixel pads 130 may be positioned on a part of the first connection layer 150 on the pixel array region PXA of the first substrate 110. That is, the plurality of first pixel pads 130 may overlap the pixel array region PXA of the first substrate 110 in the Z direction. In an exemplary embodiment, the first pixel pads 130 are positioned so they do not overlap the photoelectric conversion units PD in the Z direction. The plurality of second pixel pads 230 may be respectively positioned on the plurality of first pixel pads 130 to be in contact with the plurality of first pixel pads 130, respectively. The plurality of first pixel pads 130 and the plurality of second pixel pads 230 may be used for the direct bonding of the first structure 100 and the second structure 200.

In an exemplary embodiment, each first pixel pad 130 includes a filling layer 131 and a barrier layer 132 between the filling layer 131 and the first connection layer 150. In an exemplary embodiment, each second pixel pad 230 includes a filling layer 231 and a barrier layer 232 between the filling layer 231 and the second connection layer 250. The filling layer 131 of the first pixel pad 130 and the filling layer 231 of the second pixel pad 230 may be used for the direct bonding. In an exemplary embodiment, the filling layers 131 and 231 include a material having a high reflectivity. For example, the filling layers 131 and 231 corresponding to a pixel region PX may reflect light towards a photoelectric conversion unit PD within the same pixel region PX. For example, the filling layer 131 of the first pixel pad 130 and the filling layer 231 of the second pixel pad 230 may include copper (Cu), aluminum (Al), or a combination thereof. The barrier layer 132 of the first pixel pad 130 and the barrier layer 232 of the second pixel pad 230 may prevent the materials of the filling layer 131 of the first pixel pad 130 and the filling layer 231 of the second pixel pad 230 from diffusing into the first insulating layer 151 of the first connection layer 150 and the second insulating layer 251 of the second connection layer 250, respectively. In an exemplary embodiment, the barrier layers 132 and 232 include a material having a high reflectivity. For example, the barrier layers 132 and 232 corresponding to a pixel region PX may reflect light towards a photoelectric conversion unit PD within the same pixel region PX. For example, the barrier layer 132 of the first pixel pad 130 and the barrier layer 232 of the second pixel pad 230 may include titanium (Ti), tantalum (Ta), tin (Sn), and copper (Cu), aluminum (Al), gold (Au), silver (Ag), or a combination thereof.

In an exemplary embodiment, the plurality of first pixel pads 130 are disposed to relieve bonding stress that may occur when bonding the first structure 100 to the second structure 200 due to the thermal expansion coefficient difference between various materials. In an exemplary embodiment, centers C130 of the plurality of first pixel pads 130 do not overlap the pixel separation pattern 160 in the Z direction. The positioning of the centers C130 not to overlap the pixel separation patterns 160 may relieve bonding stress. In an exemplary embodiment, the plurality of first pixel pads 130 do not overlap the pixel separation pattern 160 in the Z direction. The positioning of first pixel pads 130 not to overlap the pixel separation patterns 160 may relieve bonding stress. In another exemplary embodiment, the plurality of first pixel pads 130 do not overlap a boundary between the plurality of pixel regions PX of the first substrate 110 in the Z direction. That is, any first pixel pad 130 may not spread over two or more neighboring pixel regions PX of the first substrate 110. In an exemplary embodiment, none of the first pixel pads 130 extend to overlap a pair of adjacent pixel regions PX.

In an exemplary embodiment, the plurality of first pixel pads 130 are arranged in the X direction at a pitch DX1 that is substantially the same as a pitch DX3 of the plurality of pixel regions PX in the X direction. In an exemplary embodiment, the plurality of first pixel pads 130 are arranged in the Y direction at a pitch DY1 that is substantially the same as a pitch DY3 of the plurality of pixel regions PX in the Y direction. Accordingly, the plurality of first pixel pads 130 may overlap the plurality of pixel regions PX of the first substrate 110 in a vertical direction, respectively. By arranging the plurality of first pixel pads 130 as described above, not only the bonding stress may be relieved but also a planar surface may be obtained when the first structure 100 is planarized using a chemical mechanical polish (CMP).

In an exemplary embodiment in which the pitch DX1 of the plurality of first pixel pads 130 in the X direction is substantially the same as the pitch DX3 of the plurality of pixel regions PX of the first substrate 110 in the X direction, a width DX7 of each of the first pixel pad 130 and the second pixel pad 230 in the X direction is greater than 0 and is less than or the same as half of the pitch DX3 of the plurality of pixel regions PX of the first substrate 110 in the X direction. Similarly, in an exemplary embodiment in which the pitch DY1 of the plurality of first pixel pads 130 in the Y direction is substantially the same as the pitch DY3 of the plurality of pixel regions PX of the first substrate 110 in the Y direction, a width DY7 of each of the first pixel pad 130 and the second pixel pad 230 in the Y direction is greater than 0 and less than or the same as half of the pitch DY3 of the plurality of pixel regions PX of the first substrate 110 in the Y direction.

As a result, when the first structure 100 and the second structure 200 are bonded together, even when the first structure 100 and the second structure 200 are misaligned, one first pixel pad 130 may be prevented from contacting two second pixel pads 230 or one second pixel pad 230 may be prevented from contacting two first pixel pads 130. For example, the width DX7 and the width DY7 of the first pixel pad 130 and the second pixel pad 230 in the X direction and in the Y direction respectively may be about 0.1 µm to about 2.5 µm. In the case where the width DX7 and the width DY7 of the first pixel pad 130 and the second pixel pad 230 in the X direction and in the Y direction respectively are too small, when the first structure 100 and the second structure 200 are bonded together, it may be difficult to align the plurality of first pixel pads 130 with the plurality of second pixel pads 230, respectively.

In an exemplary embodiment, the plurality of first pixel pads 130 are arranged to reflect light that is not absorbed by the plurality of photoelectric conversion units PD and emitted from the plurality of photoelectric conversion units PD through the first connection layer 150. For example, the first pixel pads 130 may reflect non-absorbed light back at the photoelectric conversion units PD so that they absorb more light. To this end, the plurality of first pixel pads 130 may be arranged on parts of the first connection layer 150 having high transmittances. For example, a part of the first connection layer 150 on the pixel region PX of the first substrate 110 includes an overlapping portion 150a overlapping the first pixel pad 130 in the Z direction and a non-overlapping portion 150b not overlapping the first pixel pad 130 in the Z direction. In an exemplary embodiment, the transmittance of the overlapping portion 150a of the first connection layer 150 is higher than that of the non-overlapping portion 150b of the first connection layer 150.

In other words, in view of the fact that the first insulating layer 151 of the first connection layer 150 includes a material having a high transmittance and the first conductive pattern 152 includes a material having a high reflectivity, the plurality of first pixel pads 130 may be arranged on parts of the first connection layer 150 having a smaller proportion of the volume of the first conductive pattern 152 than the first insulating layer 151. For example, a ratio of the total volume of parts of the first conductive pattern 152 in the overlapping portions 150a of the first connection layer 150 with respect to the total volume of parts of the first insulating layer 151 in the overlapping portions 150a of the first connection layer 150 may be less than a ratio of the total volume of parts of the first conductive pattern 152 in the non-overlapping portions 150b of the first connection layer 150 with respect to the total volume of parts of the first insulating layer 151 in the non-overlapping portions 150b of the first connection layer 150.

Here, the total volume of the parts of the first insulating layer 151 in the overlapping portions 150a of the first connection layer 150 may be, for example, when the pixel array region PXA includes two pixel regions PX, a sum of the volume of a part of the first insulating layer 151 in the overlapping portion 150a of the part of the first connection layer 150 positioned on one pixel region and the volume of a part of the first insulating layer 151 in the overlapping portion 150a of the other part of the first connection layer 150 positioned on the other pixel region. That is, the volume ratio of the first conductive pattern 152 with respect to the first insulating layer 151 in any one overlapping portion 150a may be the same as the volume ratio of the first conductive pattern 152 with respect to the first insulating layer 151 in any one non-overlapping portion 150b, but the volume ratio of the first conductive pattern 152 with respect to the first insulating layer 151 spreading over all the overlapping portions 150a in the first connection layer 150 may be less than the volume ratio of the first conductive pattern 152 with respect to the first insulating layer 151 over the all non-overlapping portions 150b in the first connection layer 150. By arranging the plurality of first pixel pads 130 as described above, an amount of light leaked through a relatively low density region (e.g., the overlapping portion 150a) of the first conductive pattern 152 may be reduced, and therefore, the sensitivity of the image sensor 1000 may be improved and crosstalk may be reduced.

As a result of arranging the plurality of first pixel pads 130 to reduce the leakage of light, the center C130 of the first pixel pad 130 is beyond a center CPX of the pixel region PX of the first substrate 110 in the horizontal direction according to an exemplary embodiment. That is, the center C130 of the first pixel pad 130 does not overlap the center CPX of the pixel region PX of the first substrate 110 in the Z direction. Furthermore, in an embodiment in which the pitch DX1 of the plurality of first pixel pads 130 in the X direction is substantially the same as the pitch DX3 of the plurality of pixel regions PX of the first substrate 110 in the X direction, and/or the pitch DY1 of the plurality of first pixel pads 130 in the Y direction is substantially the same as the pitch DY3 of the plurality of pixel regions PX of the first substrate 110 in the Y direction, the center C130 of each first pixel pad 130 is located a certain distance (e.g., DX6) away from the center CPX of each pixel region PX of the first substrate 110 in the horizontal direction (e.g. in the X direction). In FIGS. 3 and 4, the center C130 of the first pixel pad 130 and the center CPX of the pixel region PX are separated in the X direction, but the center C130 of the first pixel pad 130 and the center CPX of the pixel region PX may be separated in any horizontal direction including the Y direction.

The plurality of first peripheral pads 140 may be arranged on a part of the first connection layer 150 on the peripheral region PR of the first substrate 110. That is, the plurality of first peripheral pads 140 may overlap the peripheral region PR of the first substrate 110 in the Z direction. The plurality of second peripheral pads 240 may be positioned on the plurality of first peripheral pads 140, respectively, and may contact the plurality of first peripheral pads 140, respectively. The plurality of first peripheral pads 140 and the plurality of second peripheral pads 240 may be used for the direct bonding of the first structure 100 and the second structure 200, and may electrically connect between the first connection layer 150 and the second connection layer 250, i.e. between the first structure 100 and the second structure 200.

In an exemplary embodiment, each first peripheral pad 140 includes a filling layer 141 and a barrier layer 142 between the filling layer 141 and the first connection layer 150. In an exemplary embodiment, each second peripheral pad 240 includes a filling layer 241 and a barrier layer 242 between the filling layer 241 and the second connection layer 250. The filling layer 141 of the first peripheral pad 140 and the filling layer 241 of the second peripheral pad 240 may be used for a direct bonding. In an exemplary embodiment, the filling layers 141 and 241 include a conductive material. For example, the filling layer 141 of the first peripheral pad 140 and the filling layer 241 of the second peripheral pad 240 may include copper (Cu), aluminum (Al), or a combination thereof. The barrier layer 142 of the first peripheral pad 140 and the barrier layer 242 of the second peripheral pad 240 may include materials that may prevent materials in the filling layer 141 of the first peripheral pad 140 and the filling layer 241 of the second peripheral pad 240 from diffusing into the first insulating layer 151 of the first connection layer 150 and the second insulating layer 251 of the second connection layer 250, respectively. For example, the barrier layer 142 of the first peripheral pad 140 and the barrier layer 242 of the second peripheral pad 240 may include titanium (Ti), tantalum (Ta), tin (Sn), and copper (Cu), aluminum (Al), gold (Au), silver (Ag), or a combination thereof.

In an exemplary embodiment, the plurality of first peripheral pads 140 are arranged to relieve bonding stress. For example, the pitch DX2 of the plurality of first peripheral pads 140 in the X direction may be substantially the same as the pitch DX1 of the plurality of first pixel pads 130 in the X direction. Similarly, the pitch DY2 of the plurality of first peripheral pads 140 in the Y direction may be substantially the same as the pitch DY1 of the plurality of first pixel pads 130 in the Y direction. Therefore, in an embodiment in which the pitch DX1 of the plurality of first pixel pads 130 in the X direction is the same as the pitch DX3 of the plurality of pixel regions PX of the first substrate 110 in the X direction, the pitch DX2 of the plurality of first peripheral pads 140 in the X direction may be substantially the same as the pitch DX3 of the plurality of pixel regions PX of the first substrate 110 in the X direction. Similarly, in an embodiment in which the pitch DY1 of the plurality of first pixel pads 130 in the Y direction is the same as the pitch DY3 of the plurality of pixel regions PX of the first substrate 110 in the Y direction, the pitch DY2 of the plurality of first peripheral pads 140 in the Y direction may be substantially the same as the pitch DY3 of the plurality of pixel regions PX of the first substrate 110 in the Y direction. By arranging the plurality of first peripheral pads 140 as described above, not only bonding stress may be relieved, but also a planar surface may be obtained when the first structure 100 is planarized using CMP.

In an exemplary embodiment of the inventive concept, the image sensor 1000 further includes a plurality of micro lenses 380 disposed on an upper surface of the first substrate 110. The plurality of micro lenses 380 may overlap the plurality of photoelectric conversion units PD in the Z direction, respectively. The micro lens 380 may collect or focus light into the photoelectric conversion unit PD.

In an exemplary embodiment, the image sensor 1000 further includes a plurality of color filters 370 disposed on the upper surface of the first substrate 110. When the image sensor 1000 includes the plurality of micro lenses 380, the plurality of color filters 370 may be positioned between the first substrate 110 and the plurality of micro lenses 380, respectively. The plurality of color filters 370 may be respectively arranged on the plurality of photoelectric conversion units PD. The color filter 370 may pass light having a specific wavelength such that light having a specific wavelength reaches the photoelectric conversion unit PD. The plurality of color filters 370 may form, for example, a color filter array including a red filter, a green filter, and a blue filter. However, the color filter 370 may also include a yellow filter, magenta filter, cyan filter, and/or a white filter.

The image sensor 1000 according to an exemplary embodiment of the inventive concept includes the plurality of first pixel pads 130 and the plurality of second pixel pads 230. The plurality of first pixel pads 130 and the plurality of second pixel pads 230 may be used for the direct bonding of the first structure 100 and the second structure 200. By properly arranging the plurality of first pixel pads 130 and the plurality of second pixel pads 230, bonding stress that may occur when bonding the first structure 100 to the second structure 200 due to the thermal expansion coefficient difference between various materials may be relieved. Additionally or alternatively, by properly arranging the plurality of first pixel pads 130 and the plurality of second pixel pads 230, light that is not absorbed by the photoelectric conversion unit PD and emitted from the photoelectric conversion unit PD through the first connection layer 150 may be reflected, and thus leakage of light may be reduced. Therefore, the sensitivity of the image sensor 1000 may be improved and crosstalk may be reduced.

Figure 5:
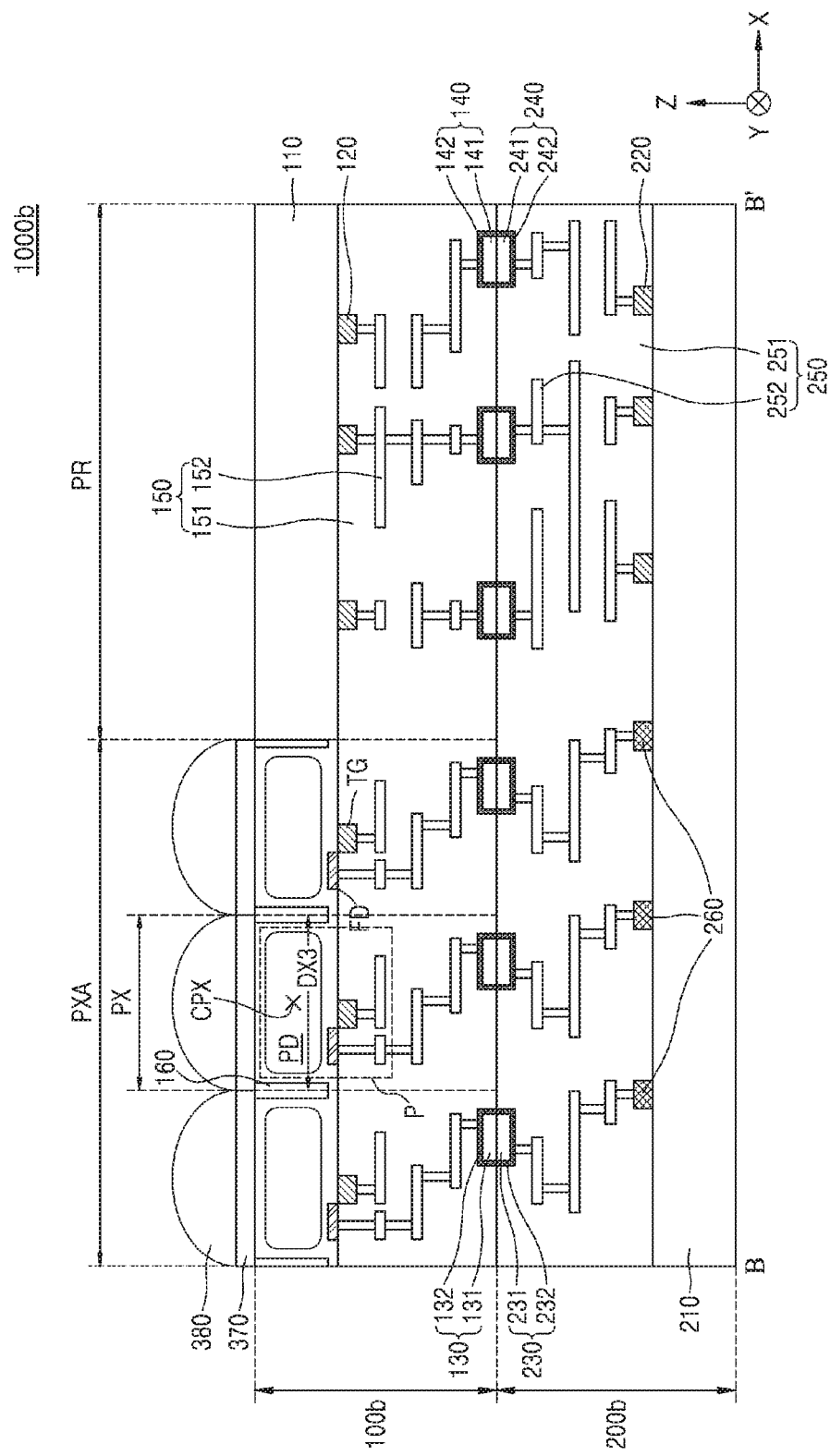
FIG. 5 is a cross-sectional view of an image sensor according to an exemplary embodiment of the inventive concept, taken along the line BB' of FIG. 3.

FIG. 5 is a cross-sectional view of an image sensor 1000*b* according to an exemplary embodiment of the inventive concept, taken along the line BB' of FIG. 3. Differences between the image sensor 1000 shown in FIG. 4 and the image sensor 1000*b* shown in FIG. 5 will be described below.

Referring to FIG. 5, the first conductive pattern 152 of the first connection layer 150 contacts at least one of the plurality of first pixel pads 130. In a further exemplary embodiment, the first conductive pattern 152 of the first connection layer 150 contacts all of the plurality of first pixel pads 130. In other words, the plurality of first pixel pads 130 are not dummy pads. In some embodiments, the first connection layer 150 may electrically connect the peripheral device 120 to the plurality of first pixel pads 130. That is, the first conductive pattern 152 of the first connection layer 150 may further include a portion electrically connecting the peripheral device 120 to the plurality of first pixel pads 130. In an exemplary embodiment, the first connection layer 150 electrically connects the plurality of pixel circuits P to the plurality of first pixel pads 130, respectively. That is, the first conductive pattern 152 of the first connection layer 150 may further include a portion electrically connecting the plurality of pixel circuits P to the plurality of first pixel pads 130, respectively.

In an exemplary embodiment, the second conductive pattern 252 of the second connection layer 250 contacts at least one of the plurality of second pixel pads 230. In a further exemplary embodiment, the second connection layer 250 contacts all of the plurality of second pixel pads 230. In other words, the plurality of second pixel pads 230 are not dummy pads. In an exemplary embodiment, the second connection layer 250 electrically connects the device 220 to the plurality of second pixel pads 230. That is, the second conductive pattern 252 of the second connection layer 250 may further include a portion electrically connecting the device 220 to the plurality of second pixel pads 230.

In an exemplary embodiment, the second structure 200*b* further includes a plurality of pixel devices 260 disposed on the second substrate 210. The plurality of pixel devices 260 may include, for example, a capacitor, a resistor, a transistor, or a combination thereof. The pixel device 260 may overlap the pixel array region PXA of the first substrate 110 in the Z direction.

In an exemplary embodiment, the second connection layer 250 connects the plurality of pixel devices 260 to the device 220. That is, the second conductive pattern 252 of the second connection layer 250 may further include a portion connecting the plurality of pixel devices 260 to the device 220. In an exemplary embodiment, the second connection layer 250 electrically connects the plurality of pixel devices 260 to the plurality of second pixel pads 230, respectively. That is, the second conductive pattern 252 of the second connection layer 250 may further include a portion electrically connecting the plurality of pixel devices 260 to the plurality of second pixel pads 230, respectively.

Figure 6:
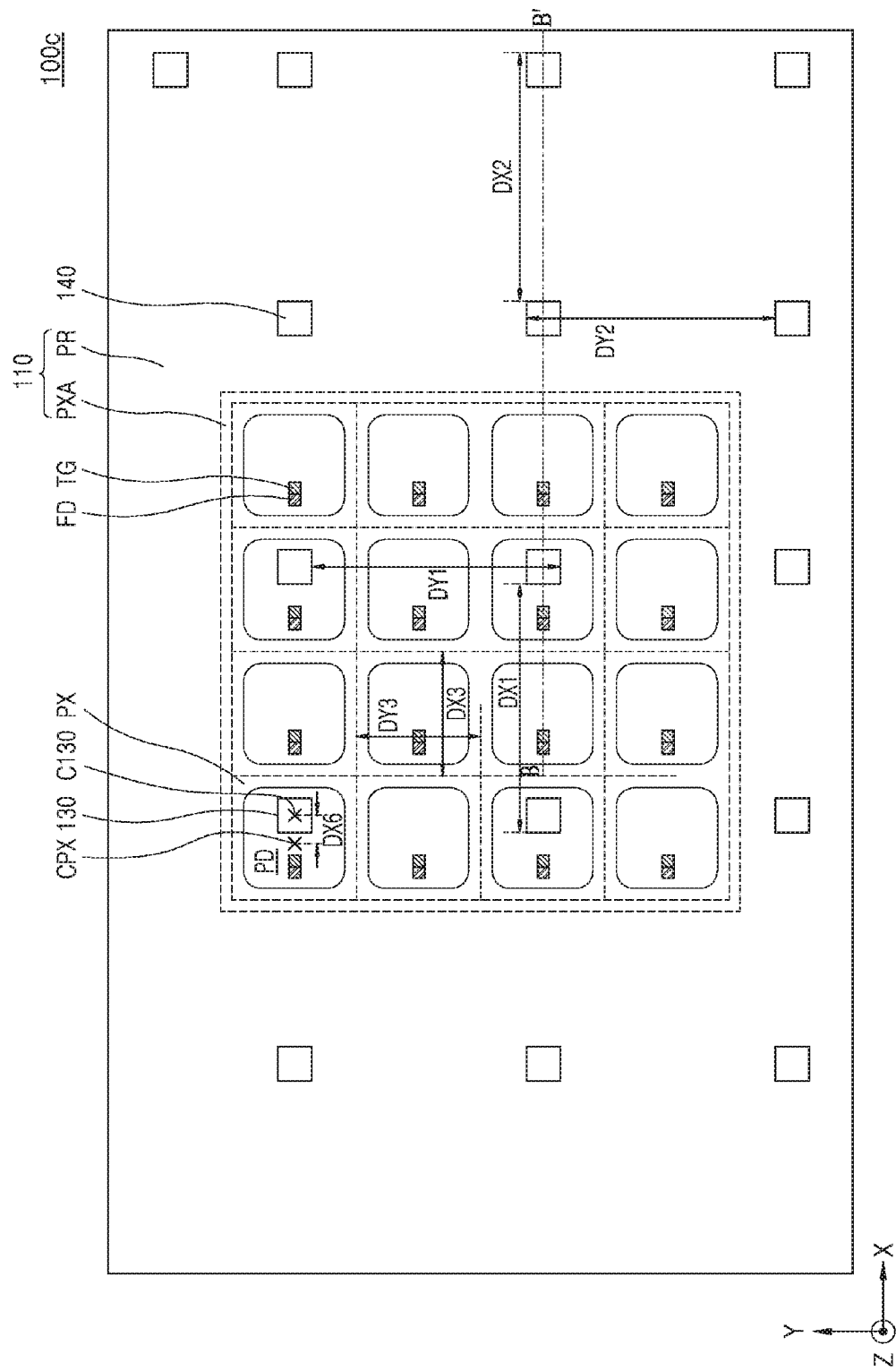
FIG. 6 is a plan view of a first structure included in an image sensor according to an exemplary embodiment of the inventive concept.
Figure 7:
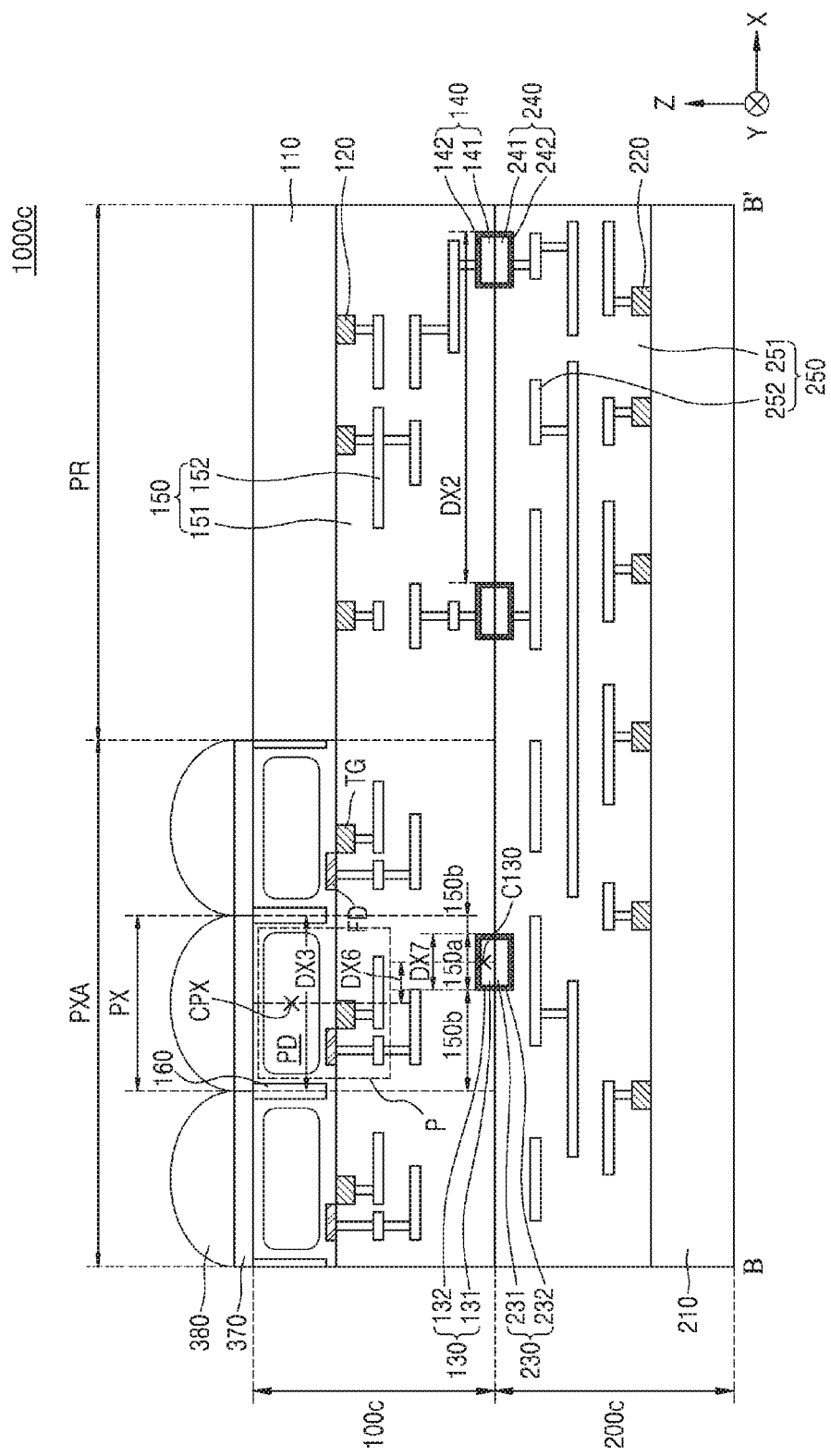
FIG. 7 is a cross-sectional view of an image sensor according to an exemplary embodiment of the inventive concept, taken along a line BB' of FIG. 6.

FIG. 6 is a plan view of a first structure 100*c* included in an image sensor 1000*c* according to an exemplary embodiment of the inventive concept. FIG. 7 is a cross-sectional view of the image sensor 1000*c* according to embodiments of the inventive concept, taken along a line BB' of FIG. 6. Hereinafter, differences between the image sensor 1000 illustrated in FIGS. 3 and 4 and the image sensor 1000*c* illustrated in FIGS. 6 and 7 will be described.

Referring to FIGS. 6 and 7, in an exemplary embodiment, the pitch DX1 of the plurality of first pixel pads 130 in the X direction is substantially the same as twice the pitch DX3 of the plurality of pixel regions PX of the first substrate 110 in the X direction. In an exemplary embodiment, the pitch DX1 of the plurality of first pixel pads 130 in the X direction is substantially the same as a value obtained by multiplying the pitch DX3 of the plurality of pixel regions PX of the first substrate 110 in the X direction by a natural number. The natural number may be any natural number that is 1 or more, for example, 1, 2, 3, 4 or the like. Similarly, in an exemplary embodiment, the pitch DY1 of the plurality of first pixel pads 130 in the Y direction is substantially the same as a value obtained by multiplying the pitch DY3 of the plurality of pixel regions PX of the first substrate 110 in the Y direction by an arbitrary natural number, for example, 2. By arranging the plurality of first pixel pads 130 as described above, not only bonding stress may be relieved, but also a planar surface may be obtained when the first structure 100*c* is planarized using CMP.

In an exemplary embodiment, the pitch DX2 of the plurality of first peripheral pads 140 in the X direction is substantially the same as a value obtained by multiplying the pitch DX3 of the plurality of pixel regions PX of the first substrate 110 in the X direction by an arbitrary natural number, for example, 2. In an exemplary embodiment, the pitch DY2 of the plurality of first peripheral pads 140 in the Y direction is substantially the same as a value obtained by multiplying the pitch DX3 of the plurality of pixel regions PX of the first substrate 110 in the Y direction by an arbitrary natural number, for example, 2. By arranging the plurality of first peripheral pads 140 as described above, not only bonding stress may be relieved, but also a planar surface may be obtained when the first structure 100*c* is planarized using CMP.

Figure 8:
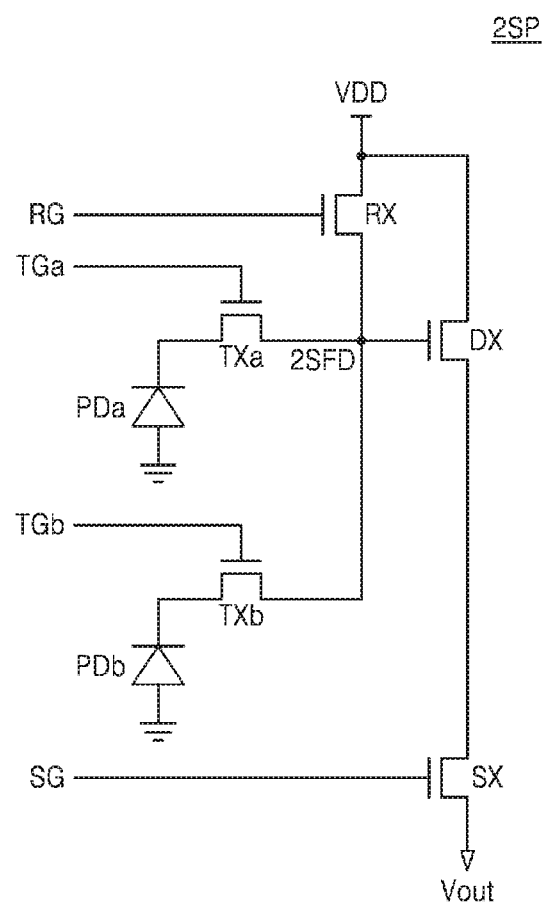
FIG. 8 is a circuit diagram of a shared pixel circuit included in an image sensor according to an exemplary embodiment of the inventive concept.
Figure 10:
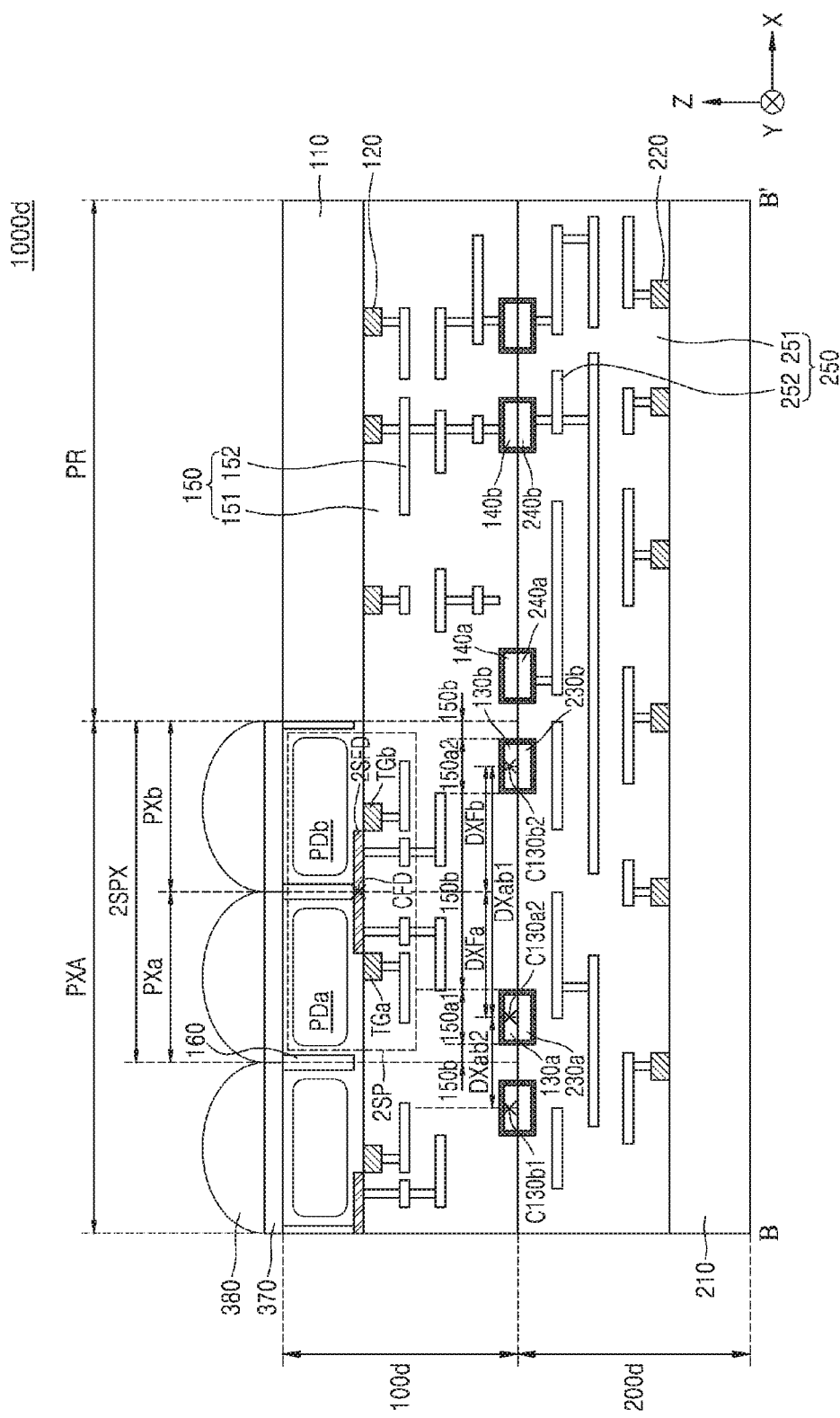
FIG. 10 is a cross-sectional view of an image sensor according to an exemplary embodiment of the inventive concept, taken along a line BB' of FIG. 9.

FIG. 8 is a circuit diagram of a shared pixel circuit 2SP included in an image sensor 1000*d* according to an exemplary embodiment of the inventive concept shown in FIG. 10. Hereinafter, differences between the pixel circuit P shown in FIG. 2 and the shared pixel circuit 2SP shown in FIG. 8 will be described.

Referring to FIG. 8, the shared pixel circuit 2SP includes two pixel circuits P (see FIG. 2) sharing the floating diffusion region FD (see FIG. 2). Specifically, the shared pixel circuit 2SP includes a first photoelectric conversion unit PDa, a second photoelectric conversion unit PDb, a first transfer transistor TXa, a second transfer transistor TXb, a shared floating diffusion region 2SFD, the drive transistor DX, the selection transistor SX, and the reset transistor RX. The first transfer transistor TXa may include a first transfer gate TGa, and the second transfer transistor TXb may include a second transfer gate TGb. The first transfer gate TGa may transfer charges accumulated in the first photoelectric conversion unit PDa to the shared floating diffusion region 2SFD, and the second transfer gate TGb may transfer charges accumulated in the second photoelectric conversion unit PDb to the shared floating diffusion region 2SFD. The drive transistor DX, the selection transistor SX, and the reset transistor RX may be connected to the shared floating diffusion region 2SFD.

Figure 9:
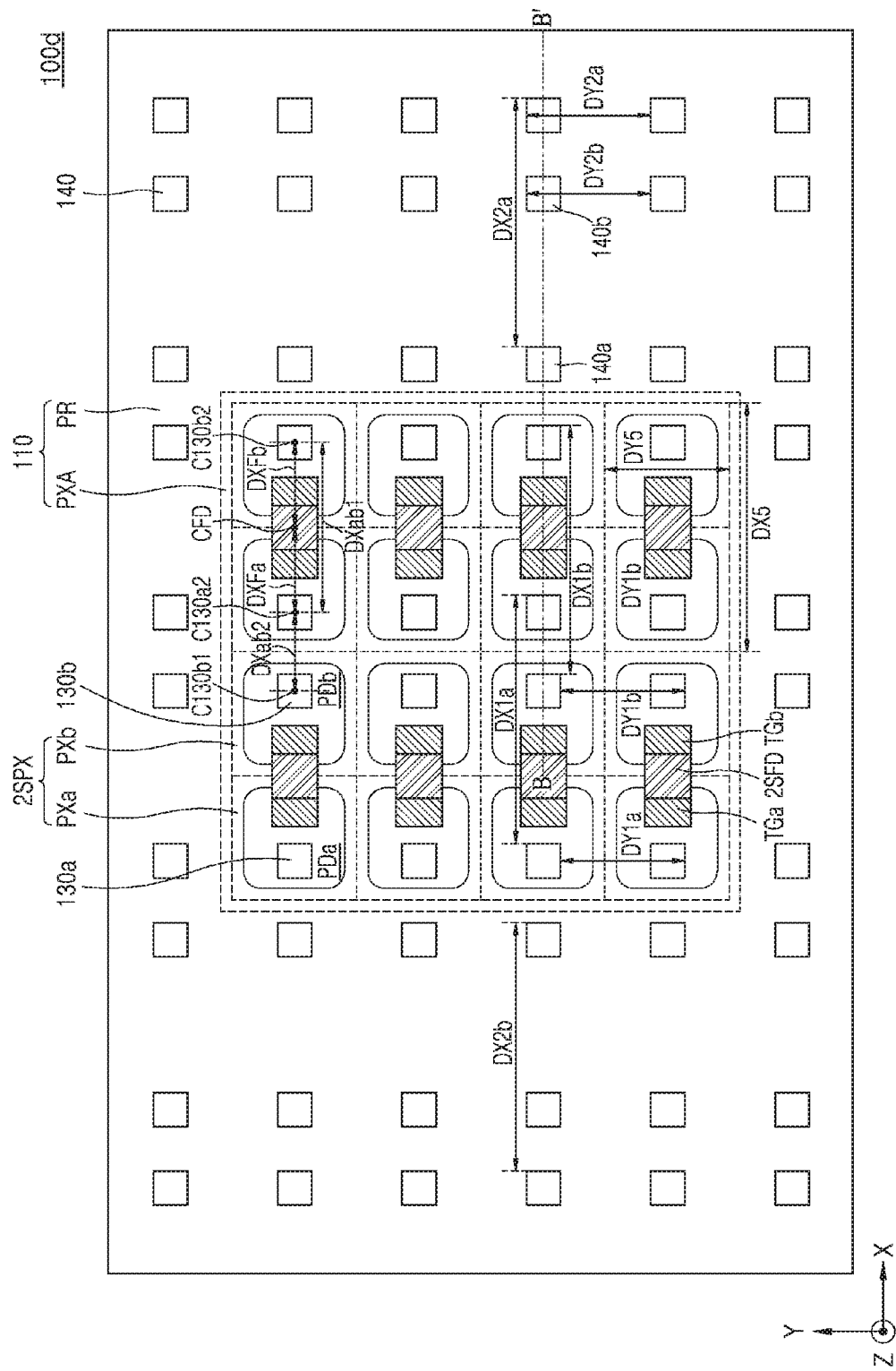
FIG. 9 is a plan view of a first structure included in an image sensor according to an exemplary embodiment of the inventive concept.

FIG. 9 is a plan view of a first structure 100*d* included in the image sensor 1000*d* according to an exemplary embodiment of the inventive concept. FIG. 10 is a cross-sectional view of the image sensor 1000*d* according to an exemplary embodiment of the inventive concept, taken along a line BB' of FIG. 9. Hereinafter, differences between the image sensor 1000 illustrated in FIGS. 3 and 4 and the image sensor 1000*d* illustrated in FIGS. 9 and 10 will be described.

Referring to FIGS. 9 and 10, the pixel array region PXA of the first substrate 110 includes a plurality of shared pixel regions 2SPX. Each shared pixel region 2SPX includes a first pixel region PXa and a second pixel region PXb adjacent to each other. In an exemplary embodiment, the plurality of shared pixel regions 2SPX are arranged at a certain pitch in the X direction and the Y direction. In an exemplary embodiment, the pitch DX5 of the plurality of shared pixel regions 2SPX in the X direction is the same as the X direction length of each shared pixel region 2SPX, and a pitch DY5 of the plurality of shared pixel regions 2SPX in the Y direction is the same as the Y direction length of each shared pixel region 2SPX. In an exemplary embodiment, the pitch DX5 is twice the pitch DY5.

The plurality of first photoelectric conversion units PDa are positioned in the plurality of first pixel regions PXa of the first substrate 110, respectively, and the plurality of second photoelectric conversion units PDb are positioned in the plurality of second pixel regions PXb of the first substrate 110, respectively. In an exemplary embodiment, the pixel separation pattern 160 is positioned between the first photoelectric conversion unit PDa and the second photoelectric conversion unit PDb.

The first photoelectric conversion unit PDa and the second photoelectric conversion unit PDb are included in the shared pixel circuit 2SP. In an exemplary embodiment, the first transfer gate TGAa included in the shared pixel circuit 2SP is positioned on the first pixel region PXa of the first substrate 110 and the second transfer gate TGb included in the shared pixel circuit 2SP is positioned on the second pixel region PXb of the first substrate 110. The shared floating diffusion region 2SFD included in the shared pixel circuit 2SP may spread over the first pixel region PXa and the second pixel region PXb of the first substrate 110. For example, the shared floating diffusion region 2SFD may extend to overlap the first pixel region PXa and the second pixel region PXb. The drive transistor DX (see FIG. 8), the selection transistor SX (see FIG. 8), or the reset transistor RX (see FIG. 8) included in the shared pixel circuit 2SP may be positioned on the shared pixel region 2SPX of the first substrate 110.

The plurality of first pixel pads 130*a* and the plurality of second pixel pads 130*b* are positioned on the first connection layer 150, and the plurality of third pixel pads 230*a* and the plurality of fourth pixel pads 230*b* are positioned on the second connection layer 250. In an exemplary embodiment, the plurality of third pixel pads 230*a* are positioned on the plurality of first pixel pads 130*a* to contact the plurality of first pixel pads 130*a*, respectively. In an exemplary embodiment, the plurality of fourth pixel pads 230*b* are positioned on the plurality of second pixel pads 130*b* to contact the plurality of second pixel pads 130*b*, respectively. The plurality of first pixel pads 130*a* and the plurality of second pixel pads 130*b* may be positioned on a portion of the first connection layer 150 on the pixel array region PXA of the first substrate 110. That is, the plurality of first pixel pads 130a and the plurality of second pixel pads 130b may overlap the pixel array region PXA of the first substrate 110 in the Z direction.

In an exemplary embodiment, a distance DXFa between the first pixel pad 130a and the shared floating diffusion region 2SFD in the horizontal direction (e.g., the X direction) is substantially the same as a distance DXFb between the second pixel pad 130b and the shared floating diffusion region 2SFD in the horizontal direction (e.g., the X direction). Here, the distance DXFa between the first pixel pad 130a and the shared floating diffusion region 2SFD in the horizontal direction (e.g., the X direction) may be defined as a distance between a center C130a2 of the first pixel pad 130a and a center CFD of the shared floating diffusion region 2SFD in the horizontal direction (e.g., the X direction). In addition, the distance DXFb between the second pixel pad 130b and the shared floating diffusion region 2SFD in the horizontal direction (e.g., the X direction) may be defined as a distance between a center C130b2 of the second pixel pad 130b and the center CFD of the shared floating diffusion region 2SFD in the horizontal direction (e.g., the X direction).

In an exemplary embodiment, the centers C130a2 of the plurality of first pixel pads 130a and the centers C130b2 of the plurality of second pixel pads 130b do not overlap the pixel separation pattern 160 in the Z direction. In a further exemplary embodiment, the plurality of first pixel pads 130a and the plurality of second pixel pads 130b do not overlap the pixel separation pattern 160 in the Z direction. In another exemplary embodiment, each of the first pixel pad 130a and the second pixel pad 130b do not overlap a boundary between the first pixel region PXa and the second pixel region PXb of the first substrate 110 in the Z direction. That is, any first pixel pad 130a may not spread over the first pixel region PXa and the second pixel region PXb, and any second pixel pad 130b may not also spread over the first pixel region PXa and the second pixel region PXb. In an exemplary embodiment, a first pixel pad 130a does not extend to overlap the second pixel region PXb and a second pixel pad 130b does not extend to overlap the first pixel region PXa.

In an exemplary embodiment, a pitch DX1a of the plurality of first pixel pads 130a in the X direction and a pitch DX1b of the plurality of second pixel pads 130b in the X direction is substantially the same as a value obtained by multiplying the pitch DX5 of the plurality of shared pixel regions 2SPX in the X direction by a natural number. For example, the pitch DX1a of the plurality of first pixel pads 130a in the X direction and the pitch DX1b of the plurality of second pixel pads 130b in the X direction may be substantially the same as the pitch DX5 of the plurality of shared pixel regions 2SPX in the X direction. In an exemplary embodiment, a pitch DY1a of the plurality of first pixel pads 130a in the Y direction and a pitch DY1b of the plurality of second pixel pads 130b in the Y direction is substantially the same as a value obtained by multiplying the pitch DY5 of the plurality of shared pixel regions 2SPX in the Y direction by a natural number. For example, the pitch DY1a of the plurality of first pixel pads 130a in the Y direction and the pitch DY1b of the plurality of second pixel pads 130b in the Y direction may be substantially the same as the pitch DY5 of the plurality of shared pixel regions 2SPX in the Y direction. In an exemplary embodiment, the first pixel pad 130a overlaps the first pixel region PXa of the first substrate 110 in the Z direction, and the second pixel pad 130b overlaps the second pixel region PXb of the first substrate 110 in the Z direction. By arranging the plurality of first pixel pads 130a and the plurality of second pixel pads 130b as described above, not only bonding stress may be relieved, but also a planar surface may be obtained when the first structure 100d is planarized using CMP.

When a portion of the first connection layer 150 disposed on the shared pixel region 2SPX of the first substrate 110 includes an overlapping portion including a first overlapping portion 150a1 overlapping the first pixel pad 130a in the Z direction and a second overlapping portion 150a2 overlapping the second pixel pad 130b in the Z direction and a non-overlapping portion 150b not overlapping the first pixel pad 130a in the Z direction and not overlapping the second pixel pad 130b in the Z direction, the transmittance of the overlapping portions 150a1 and 150a2 of the first connection layer 150 may be higher than the transmittance of the non-overlapping portion 150b of the first connection layer 150.

In an exemplary embodiment, a ratio of the total volume of portions of the first conductive pattern 152 in the overlapping portions 150a1 and 150a2 of the first connection layer 150 with respect to the total volume of portions of the first insulating layer 151 in the overlapping portions 150a1 and 150a2 of the first connection layer 150 is less than a ratio of the total volume of portions of the first conductive pattern 152 in the non-overlapping portions 150b of the first connection layer 150 with respect to the total volume of portions of the first insulating layer 151 in the non-overlapping portions 150b of the first connection layer 150. By arranging the plurality of first pixel pads 130 as described above, the leakage of light may be reduced, and thus the sensitivity of the image sensor 1000d may be improved and crosstalk may be reduced.

As a result of arranging the plurality of first pixel pads 130a and the plurality of second pixel pads 130b to reduce the leakage of light, an intra-shared pixel distance DXab1 between the first pixel pad 130a of a first shared pixel region and the second pixel pad 130b of the first shared pixel region in the horizontal direction (e.g., the X direction) may be substantially different from an inter-shared pixel distance DXab2 between the first pixel pad 130a of the first shared pixel region and the second pixel pad 130b of a second adjacent shared pixel region in the horizontal direction (e.g., the X direction). Here, the intra-shared pixel distance DXab1 between the first pixel pad 130a and the second pixel pad 130b in the horizontal direction (e.g., the X direction) may be defined as a distance in the horizontal direction (e.g., the X direction) between a center C130a2 of the first pixel pad 130a and a center C130b2 of the second pixel pad 130b overlapping the same shared pixel region 2SPX in the Z direction. In addition, the distance DXab2 between the first pixel pad 130a and the second pixel pad 130b in the horizontal direction (e.g., the X direction) may be defined as a distance in the horizontal direction (e.g., the X direction) between the center C130a2 of the first pixel pad 130a and a center C130b1 of the second pixel pad 130b overlapping the neighboring two shared pixel regions 2SPX in the Z direction, respectively.

The plurality of first peripheral pads 140a and the plurality of second peripheral pads 140b may be positioned on portions of the first connection layer 150 on the peripheral region PR of the first substrate 110. That is, the plurality of first peripheral pads 140a and the plurality of second peripheral pads 140b may overlap the peripheral region PR of the first substrate 110 in the Z direction. In an exemplary embodiment, the plurality of third peripheral pads 240a are respectively positioned on the plurality of first peripheral pads 140a to contact the plurality of first peripheral pads 140a, respectively. In an exemplary embodiment, the plurality of fourth peripheral pads 240b are respectively positioned on the plurality of second peripheral pads 140b to contact the plurality of second peripheral pads 140b, respectively.

In an exemplary embodiments, the pitch DX2a of the plurality of first peripheral pads 140a in the X direction is substantially the same as the pitch DX1a of the plurality of first pixel pads 130a in the X direction, and the pitch DX2b of the plurality of second peripheral pads 140b in the X direction is substantially the same as the pitch DX1b of the plurality of second pixel pads 130b in the X direction. Similarly, in an exemplary embodiment, the pitch DY2a of the plurality of first peripheral pads 140a in the Y direction is substantially the same as the pitch DY1a of the plurality of first pixel pads 130a in the Y direction, and the pitch DY2b of the second peripheral pad 140b in the Y direction is substantially the same as the pitch DY1b of the plurality of second pixel pads 130b in the Y direction. Therefore, the pitch DX2a of the plurality of first peripheral pads 140a in the X direction and the pitch DX2b of the plurality of second peripheral pads 140b in the X direction may be substantially the same as the pitch DX5 of the plurality of shared pixel regions 2SPX of the first substrate 110 in the X direction. The pitches DY2a of the plurality of first peripheral pads 140a in the Y direction and the pitches DY2b of the plurality of second peripheral pads 140b in the Y direction may be substantially the same as the pitch DY5 of the plurality of shared pixel regions 2SPX of the first substrate 110 in the Y direction. By arranging the plurality of first peripheral pads 140a and the plurality of second peripheral pads 140b as described above, not only bonding stress may be relieved, but also a planar surface may be obtained when the first structure 100d is planarized using CMP.

Figure 11:
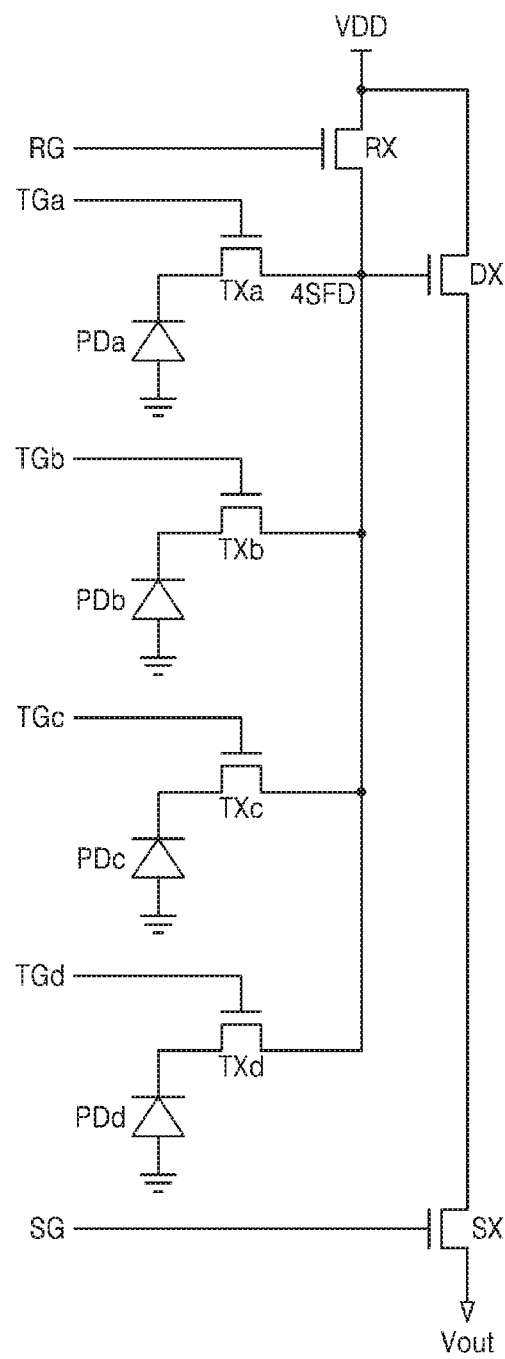
FIG. 11 is a circuit diagram of a shared pixel circuit included in an image sensor according to an exemplary embodiment of the inventive concept.

FIG. 11 is a circuit diagram of the shared pixel circuit 4SP included in an image sensor according to an exemplary embodiment of the inventive concept. Hereinafter, differences between the pixel circuit P shown in FIG. 2 and the shared pixel circuit 4SP shown in FIG. 11 will be described.

Referring to FIG. 11, the shared pixel circuit 4SP includes four pixel circuits P (see FIG. 2) sharing the floating diffusion region FD (see FIG. 2). Specifically, the shared pixel circuit 4SP includes the first to fourth photoelectric conversion units PDa, PDb, PDc, and PDd, the first to fourth transfer transistors TXa, TXb, TXc, and TXd, a shared floating diffusion region 4SFD, the drive transistor DX, the selection transistor SX, and the reset transistor RX. The first to fourth transfer transistors TXa, TXb, TXc, and TXd may include first to fourth transfer gates TGa, TGb, TGc, and TGd, respectively. The first to fourth transfer gates TGa, TGb, TGc, and TGd may transfer charges accumulated in the first to fourth photoelectric conversion units PDa, PDb, PDc, and PDd, respectively, to the shared floating diffusion region 4SFD. The drive transistor DX, the selection transistor SX, and the reset transistor RX may be connected to the shared floating diffusion region 4SFD.

Figure 12:
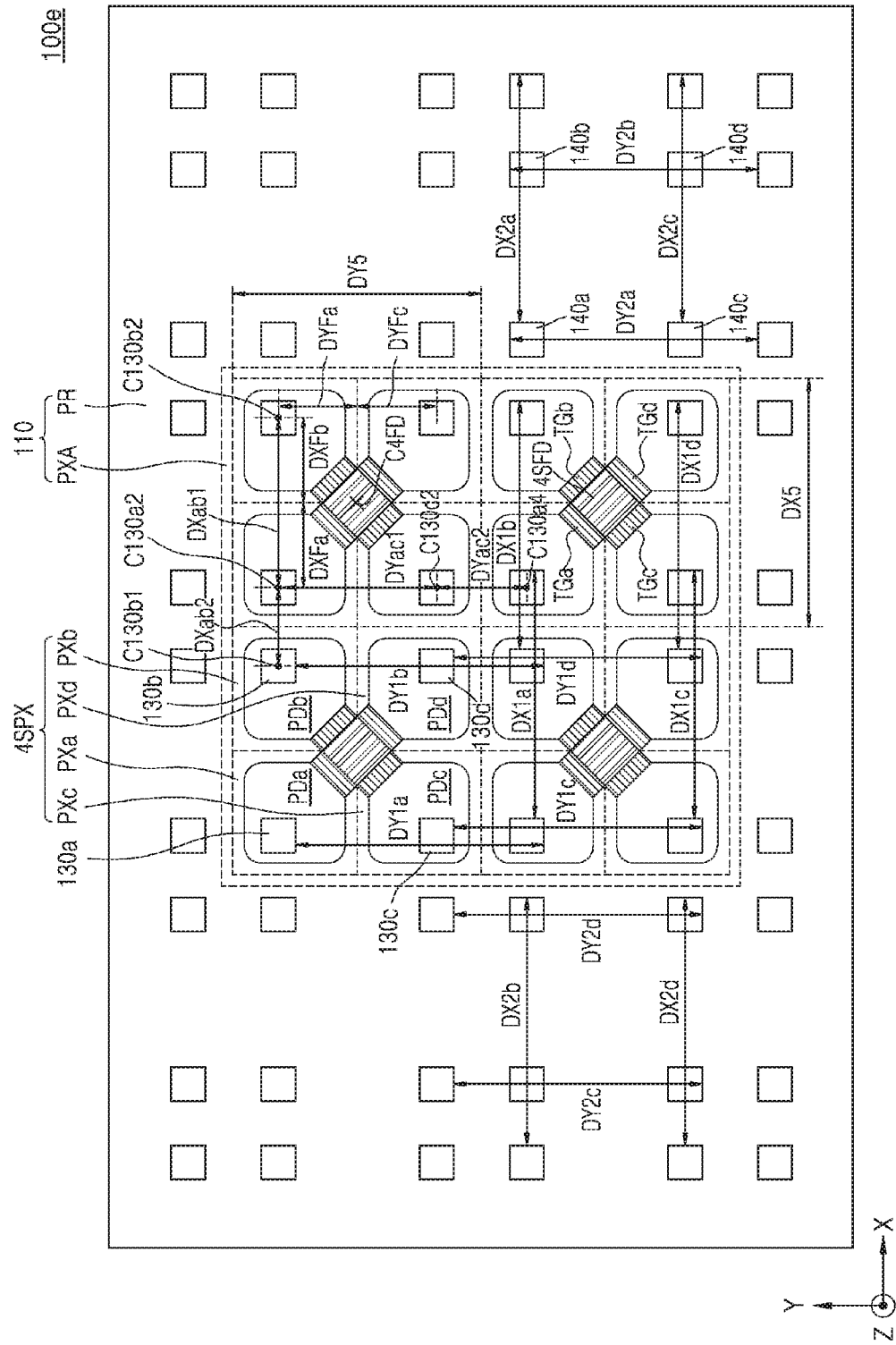
FIG. 12 is a plan view of a first structure included in an image sensor according to an exemplary embodiment of the inventive concept.

FIG. 12 is a plan view of a first structure 100e included in an image sensor according to an exemplary embodiment of the inventive concept. Differences between the first structure 100d shown in FIG. 9 and the first structure 100e shown in FIG. 12 will be described below.

Referring to FIG. 12, the pixel array region PXA of the first substrate 110 includes a plurality of shared pixel regions 4SPX. Each shared pixel region 4SPX includes neighboring first to fourth pixel regions PXa, PXb, PXc, and PXd. The plurality of third photoelectric conversion units PDc are positioned in the plurality of third pixel regions PXc of the first substrate 110, respectively, and the plurality of fourth photoelectric conversion units PDd are positioned in the plurality of fourth pixel regions PXd of the first substrate 110. In an exemplary embodiment, the third transfer gate TGc is positioned on the third pixel region PXc of the first substrate 110, and the fourth transfer gate TGd is positioned on the fourth pixel region PXd of the first substrate 110. The shared floating diffusion region 4SFD may spread over the first pixel region PXa, the second pixel region PXb, the third pixel region PXc, and the fourth pixel region PXd of the first substrate 110. For example, the shared floating diffusion region 4SFD may extend to overlap the first pixel region PXa, the second pixel region PXb, the third pixel region PXc, and the fourth pixel region PXd.

The first structure 100e further includes a plurality of fifth pixel pads 130c and a plurality of sixth pixel pads 130d. The plurality of fifth pixel pad 130c and the plurality of sixth pixel pad 130d may overlap the pixel array region PXA of the first substrate 110 in the Z direction.

In an exemplary embodiment, a distance DYFa between the first pixel pad 130a and the shared floating diffusion region 4SFD in the horizontal direction (e.g., the Y direction) is substantially the same as a distance DYFc between the fifth pixel pad 130c and the shared floating diffusion region 4SFD in the horizontal direction (e.g., the Y direction). Here, the distance DYFa between the first pixel pad 130a and the shared floating diffusion region 4SFD in the horizontal direction (e.g., the Y direction) may be defined as a distance between the center C130a2 of the first pixel pad 130a and a center C4FD of the shared floating diffusion region 4SFD in the horizontal direction (e.g., the Y direction). Further, the distance DYFc between the fifth pixel pad 130c and the shared floating diffusion region 4SFD in the horizontal direction (e.g., the Y direction) may be defined as a distance between the center C130c2 of the fifth pixel pad 130c and the center C4FD of the shared floating diffusion region 4SFD in the horizontal direction (e.g., the Y direction).

In an exemplary embodiment, a pitch DX1c of the plurality of fifth pixel pads 130c in the X direction and a pitch DX1d of the plurality of sixth pixel pads 130d in the X direction is substantially the same as a value obtained by multiplying the pitch DX5 of the plurality of shared pixel regions 4SPX in the X direction by a natural number. For example, the pitch DX1c of the plurality of fifth pixel pads 130c in the X direction and the pitch DX1d of the plurality of sixth pixel pads 130d in the X direction may be substantially the same as the pitch DX5 of the plurality of shared pixel regions 4SPX in the X direction. In addition, a pitch DY1c of the plurality of fifth pixel pads 130c in the Y direction and a pitch DY1d of the plurality of sixth pixel pads 130d in the Y direction may be substantially the same as a value obtained by multiplying the pitch DY5 of the plurality of shared pixel regions 4SPX in the Y direction by a natural number. For example, the pitch DY1c of the plurality of fifth pixel pads 130c in the Y direction and the pitch DY1d of the plurality of sixth pixel pads 130d in the Y direction may be substantially the same as the pitch DY5 of the plurality of shared pixel regions 4SPX in the Y direction In an exemplary embodiment, the fifth pixel pad 130c overlaps the third pixel region PXc of the first substrate 110 in the Z direction, and the sixth pixel pad 130d overlaps the fourth pixel region PXd of the first substrate 110 in the Z direction. By arranging the plurality of fifth pixel pads 130c and the plurality of sixth pixel pads 130d as described above, not only bonding stress may be relieved, but also a planar surface may be obtained when the first structure 100e is planarized using CMP.

As a result of arranging the plurality of fifth pixel pad 130c and the plurality of sixth pixel pad 130d to reduce the leakage of light, a distance DYac1 between the first pixel pad 130a of a first shared pixel region and the fifth pixel pad 130c in the first shared pixel region in the horizontal direction (e.g., the Y direction) may be substantially different from an inter-shared pixel region distance DYac2 between the first pixel pad 130a of a second shared pixel region and the fifth pixel pad 130c of the first shared pixel region in the horizontal direction (e.g., the Y direction). Here, the distance DYac1 between the first pixel pad 130a and the fifth pixel pad 130c in the horizontal direction (e.g., the Y direction) may be defined as a distance in the horizontal direction (e.g., the Y direction) between the center C130a2 of the first pixel pad 130a and a center C130c2 of the fifth pixel pad 130c overlapping the same shared pixel region 4SPX in the Z direction. In addition, the inter-shared pixel region distance DYac2 between the first pixel pad 130a and the fifth pixel pad 130c in the horizontal direction (e.g., the Y direction) may be defined as a distance in the horizontal direction (e.g., the Y direction) between the center C130a4 of the first pixel pad 130a and a center C130c2 of the fifth pixel pad 130c overlapping the neighboring two shared pixel regions 4SPX in the Z direction respectively The plurality of fifth peripheral pads 140c and the plurality of sixth peripheral pads 140d may overlap the peripheral region PR of the first substrate 110 in the Z direction. In an exemplary embodiment, a pitch DX2c of the plurality of fifth peripheral pads 140c in the X direction is substantially the same as a pitch DX1c of the plurality of fifth pixel pads 130c in the X direction, and a pitch DX2d of the plurality of sixth peripheral pads 140d in the X direction is substantially the same as a pitch DX1d of the plurality of sixth pixel pads 130d in the X direction. Similarly, in an exemplary embodiment, a pitch DY2c of the plurality of fifth peripheral pads 140c in the Y direction is substantially the same as a pitch DY1c of the plurality of fifth pixel pads 130c in the Y direction, and a pitch DY2d of the plurality of sixth peripheral pads 140d in the Y direction is substantially the same as a pitch DY1d of the plurality of sixth pixel pad 130d in the Y direction. Therefore, the pitch DX2c of the plurality of fifth peripheral pads 140c in the X direction and the pitch DX2d of the plurality of sixth peripheral pads 140d in the X direction may be substantially the same as the pitch DX5 of the plurality of shared pixel regions 4SPX of the first substrate 110 in the X direction. The pitch DY2c of the plurality of fifth peripheral pads 140c in the Y direction and the pitch DY2d of the plurality of sixth peripheral pads 140d in the Y direction may be substantially the same as the pitch DY5 of the plurality of shared pixel regions 4SPX of the first substrate 110 in the Y direction. By arranging the plurality of fifth peripheral pads 140c and the plurality of sixth peripheral pads 140d as described above, not only bonding stress may be relieved, but also a planar surface may be obtained when the first structure 100e is planarized using CMP.

While the inventive concept has been particularly shown and described with reference to embodiments thereof, it will be understood that various changes in form and details may be made therein without departing from the spirit and scope of the inventive concept.

What is claimed is:
1. An image sensor comprising:
 a first substrate comprising a pixel array region comprising a plurality of pixel regions and a peripheral region around the pixel array region;
 a plurality of photoelectric conversion units respectively positioned in the plurality of pixel regions of the first substrate;
 a first connection layer disposed on the pixel array region and the peripheral region of the first substrate;
 a plurality of first pixel pads disposed on a portion of the first connection layer on the pixel array region of the first substrate;
 a plurality of first peripheral pads disposed on a portion of the first connection layer on the peripheral region of the first substrate;
 a plurality of second pixel pads respectively positioned on the plurality of first pixel pads;
 a plurality of second peripheral pads respectively positioned on the plurality of first peripheral pads;
 a second connection layer disposed on the plurality of second pixel pads and the plurality of second peripheral pads;
 a device disposed on the second connection layer; and
 a second substrate disposed on the second connection layer and the device,
 wherein a pitch of the plurality of first pixel pads in a first horizontal direction is substantially the same as a pitch of the plurality of pixel regions of the first substrate in the first horizontal direction, and wherein a center of each of the plurality of first pixel pads is spaced by a predetermined distance in a second horizontal direction from a center of each of the plurality of pixel regions of the first substrate,
 wherein a portion of the first connection layer disposed on each of the plurality of pixel regions of the first substrate comprises an overlapping portion overlapping each of the plurality of first pixel pads in a plan view and a non-overlapping portion that does not overlap each of the plurality of first pixel pads in the plan view, and wherein a transmittance of the overlapping portion of the first connection layer is higher than that of the non-overlapping portion of the first connection layer.

2. The image sensor of claim 1, wherein a pitch of the plurality of first peripheral pads in the first horizontal direction is substantially the same as the pitch of the plurality of pixel regions of the first substrate in the first direction.

3. The image sensor of claim 1, wherein a width of each of the plurality of first pixel pads and the plurality of second pixel pads in the first horizontal direction is greater than 0 and less than or the same as a half of the pitch of the plurality of pixel regions of the first substrate in the first horizontal direction.

4. The image sensor of claim 1, further comprising a pixel separation pattern disposed between the plurality of photoelectric conversion units, where the center of each of the plurality of first pixel pads does not overlap the pixel separation pattern in a plan view.

5. The image sensor of claim 4, wherein the plurality of first pixel pads do not overlap the pixel separation pattern in the plan view.

6. The image sensor of claim 1, wherein each of the plurality of first pixel pads comprises a filling layer and a barrier layer disposed between the filling layer and the first connection layer.

7. The image sensor of claim 6, wherein the filling layer comprises copper (Cu), aluminum (Al), or a combination thereof, and the barrier layer comprises titanium (Ti), tantalum (Ta), tin (Sn), copper (Cu), aluminum (Al), gold (Au), silver (Ag), or a combination thereof.

8. The image sensor of claim 1, wherein the first connection layer does not electrically connect a plurality of pixel circuits respectively comprising the plurality of first photoelectric conversion units to the plurality of first pixel pads.

9. The image sensor of claim 1, wherein the first connection layer electrically connects a plurality of pixel circuits respectively comprising the plurality of first photoelectric conversion units to the plurality of first pixel pads, respectively.

10. The image sensor of claim 9, further comprising a plurality of pixel devices disposed on the second substrate, wherein the second connection layer electrically connects the plurality of pixel devices to the plurality of second pixel pads, respectively.

11. An image sensor comprising:
a first structure comprising a first substrate comprising a plurality of pixel regions, a plurality of photoelectric conversion units respectively positioned in the plurality of pixel regions of the first substrate, a first connection layer disposed on the first substrate, and a plurality of first pixel pads disposed on the first connection layer; and
a second structure comprising a second substrate, a device disposed on the second substrate, a second connection layer disposed on the second substrate and the device, and a plurality of second pixel pads disposed on the second connection layer,
wherein the plurality of first pixel pads respectively contact the plurality of second pixel pads,
wherein the first connection layer comprises an insulating layer disposed on the first substrate, and a conductive pattern disposed in the insulating layer,
wherein a portion of the first connection layer positioned on the plurality of pixel regions of the first substrate comprises a plurality of overlapping portions respectively overlapping the plurality of first pixel pads in a plan view and a plurality of non-overlapping portions that do not overlap the plurality of first pixel pads in the plan view, and
wherein a ratio of a total volume of a plurality of portions of the conductive pattern positioned respectively in the plurality of overlapping portions of the first connection layer with respect to a total volume of a plurality of portions of the insulating layer positioned respectively in the plurality of overlapping portions of the first connection layer is less than a ratio of total volume of a plurality of portions of the conductive pattern positioned respectively in the plurality of non-overlapping portions of the first connection layer with respect to total volume of a plurality of portions of the insulating layer positioned respectively in the plurality of non-overlapping portions of the first connection layer.

12. The image sensor of claim 11, wherein the plurality of first pixel pads do not overlap a boundary between the plurality of pixel regions of the first substrate in the plan view.

13. The image sensor of claim 11, wherein a pitch of the plurality of first pixel pads in a horizontal direction is substantially the same as a value obtained by multiplying a natural number by a pitch of the plurality of pixel regions of the first substrate in the horizontal direction.

14. The image sensor of claim 13, wherein the pitch of the plurality of first pixel pads in the horizontal direction is substantially same as the pitch of the plurality of pixel regions of the first substrate in the horizontal direction.

15. The image sensor of claim 11, wherein the conductive pattern does not contact at least one of the plurality of pixel pads.

16. The image sensor of claim 11, wherein the conductive pattern contacts at least one of the plurality of pixel pads.

17. An image sensor comprising:
a first substrate comprising a pixel array region comprising a plurality of pixel regions and a peripheral region around the pixel array region;
a plurality of photoelectric conversion units respectively positioned in the plurality of pixel regions of the first substrate;
a first connection layer disposed on the pixel array region and the peripheral region of the first substrate;
a plurality of first pixel pads disposed on a portion of the first connection layer on the pixel array region of the first substrate;
a plurality of first peripheral pads disposed on a portion of the first connection layer on the peripheral region of the first substrate;
a plurality of second pixel pads respectively positioned on the plurality of first pixel pads;
a plurality of second peripheral pads respectively positioned on the plurality of first peripheral pads;
a second connection layer disposed on the plurality of second pixel pads and the plurality of second peripheral pads;
a device disposed on the second connection layer; and
a second substrate disposed on the second connection layer and the device,
wherein a pitch of the plurality of first pixel pads in a first horizontal direction is substantially the same as a pitch of the plurality of pixel regions of the first substrate in the first horizontal direction, and wherein a center of each of the plurality of first pixel pads is spaced by a predetermined distance in a second horizontal direction from a center of each of the plurality of pixel regions of the first substrate,
wherein each photoelectric conversion unit overlaps a floating diffusion region in a plan view.

18. The image sensor of claim 17, wherein the floating diffusion has impurities of a conductivity type different from that of the first substrate.

* * * * *